US009170159B2

(12) United States Patent
Powell et al.

(10) Patent No.: US 9,170,159 B2
(45) Date of Patent: *Oct. 27, 2015

(54) VARIABLE APERTURE AND ACTUATOR ASSEMBLIES FOR AN IMAGING SYSTEM

(71) Applicant: DRS RSTA, Inc., Melbourne, FL (US)

(72) Inventors: Donald A. Powell, Dallas, TX (US); Falvey L. Malarcher, Plano, TX (US)

(73) Assignee: DRS Network & Imaging Systems, LLC, Melbourne, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/262,383

(22) Filed: Apr. 25, 2014

(65) Prior Publication Data

US 2015/0077825 A1    Mar. 19, 2015

Related U.S. Application Data

(63) Continuation of application No. 13/914,398, filed on Jun. 10, 2013, now Pat. No. 8,746,570, which is a continuation of application No. 12/785,695, filed on May 24, 2010, now Pat. No. 8,474,721, which is a continuation of application No. 11/761,161, filed on Jun. 11, 2007, now Pat. No. 7,724,412.

(51) Int. Cl.
*G01J 5/08* (2006.01)
*G01J 5/06* (2006.01)
*H04N 5/33* (2006.01)

(52) U.S. Cl.
CPC .. *G01J 5/084* (2013.01); *G01J 5/06* (2013.01); *G01J 5/061* (2013.01); *G01J 5/08* (2013.01); *G01J 5/0831* (2013.01); *H04N 5/33* (2013.01); *H01L 2224/48091* (2013.01)

(58) Field of Classification Search
CPC ............................... G01J 5/084; G01J 5/0831
USPC ............ 235/462.11, 462.24, 462.41; 359/235
See application file for complete search history.

(56) References Cited

U.S. PATENT DOCUMENTS 24,356 A    6/1859  Miller
582,219 A    5/1897  Mosher
(Continued)

FOREIGN PATENT DOCUMENTS

DE    2408932 A1    9/1975
GB    2164470 A    3/1986
(Continued)

OTHER PUBLICATIONS

International Search Report and Written Opinion for International Application No. PCT/US2008/062480, mailed on Aug. 20, 2008, 11 pages.

(Continued)

*Primary Examiner* — Kristy A Haupt
(74) *Attorney, Agent, or Firm* — Kilpatrick Townsend & Stockton LLP

(57) ABSTRACT

An imaging system which includes a housing for a radiation detector having a window disposed above and in axial alignment with the radiation detector, a variable aperture assembly which includes a base ring having a first opening and mounted on the radiation detector housing such that the first opening is in axial alignment with the window, a plate having a first aperture and adapted to engage the base ring such that the first aperture is disposed over the window, at least one aperture blade each operatively coupled to the base ring, and an aperture drive mechanism having a body and an actuator coupling member extending at an angle from the body. In addition, the imaging system includes an actuator assembly having an actuator and an actuator arm, the actuator arm disposed adjacent to the radiation detector housing in proximity to the actuator coupling member.

15 Claims, 17 Drawing Sheets

(56) References Cited

U.S. PATENT DOCUMENTS

| | | |
|---|---|---|
| 3,938,168 A | 2/1976 | Lange |
| 4,527,876 A | 7/1985 | Tanaka et al. |
| 4,583,814 A | 4/1986 | Koetser |
| 4,783,593 A | 11/1988 | Noble |
| 4,917,362 A | 4/1990 | Wilson |
| 5,141,404 A | 8/1992 | Newcomer et al. |
| 5,737,119 A | 4/1998 | Mladjian |
| 5,966,945 A | 10/1999 | Mengel et al. |
| 6,122,919 A | 9/2000 | Patel et al. |
| 6,133,569 A | 10/2000 | Shoda et al. |
| 6,174,061 B1 | 1/2001 | Cooper |
| 6,414,708 B1 | 7/2002 | Carmeli et al. |
| 6,707,044 B2 | 3/2004 | Lannestedt et al. |
| 6,806,471 B2 | 10/2004 | Matsukuma et al. |
| 7,157,706 B2 | 1/2007 | Gat et al. |
| 7,206,158 B2 | 4/2007 | Kusumoto |
| 7,427,758 B2 | 9/2008 | Garman et al. |
| 7,724,412 B2 * | 5/2010 | Powell et al. ............. 359/234 |
| 2002/0008772 A1 | 1/2002 | Kaneda |
| 2003/0161049 A1 | 8/2003 | Okada et al. |
| 2004/0129881 A1 | 7/2004 | Hamrelius et al. |
| 2006/0002702 A1 | 1/2006 | Masuda et al. |
| 2006/0213950 A1 | 9/2006 | Marks |
| 2006/0255275 A1 | 11/2006 | Garman et al. |
| 2006/0290901 A1 | 12/2006 | Moriyama |

FOREIGN PATENT DOCUMENTS

| | | |
|---|---|---|
| JP | 5172635 | 9/1997 |
| JP | 2002-139767 A | 5/2002 |
| JP | 2003-348815 A | 12/2003 |
| JP | 2004-240025 A | 8/2004 |
| JP | 2006-184536 A | 7/2006 |
| JP | 2006-276521 A | 10/2006 |
| JP | 2007-003839 | 1/2007 |
| WO | WO2008/154087 A1 | 12/2008 |

OTHER PUBLICATIONS

Extended European Search Report mailed Feb. 7, 2014 in EP Patent Application No. 08755024.0, 9 pages.
Notice of Allowance for U.S. Appl. No. 13/914,398 mailed on Jan. 15, 2014, 7 pages.
Non-Final Office Action for U.S. Appl. No. 13/914,398 mailed on Aug. 5, 2013, 6 pages.
Notice of Allowance for U.S. Appl. No. 11/761,161 mailed on Jan. 8, 2010, 7 pages.
Non-Final Office Action for U.S. Appl. No. 12/785,695, mailed on Oct. 4, 2012, 21 pages.
Patent Examination Report No. 1 for Australian Patent Application No. 2008262163, mailed Oct. 25, 2012, 3 pages.
Notice of Allowance for U.S. Appl. No. 12/785,695, mailed on Mar. 5, 2013, 8 pages.
Final Office Action mailed Mar. 4, 2014 in JP Patent Application No. 2010-514897, 4 pages.
Japanese Office Action for Application No. 2010-514897, mailed on Jun. 18, 2013, 4 pages.
Japanese Office Action for Application No. 2010-514897, mailed on Oct. 15, 2014 5 pages.
Canada Office Action for Application No. 2,683,704, mailed on Dec. 30, 2013 12 pages.
Japan Patent Office office actions JPO patent application JP2010-514897 (Jun. 2, 2015), 3 pages.

* cited by examiner

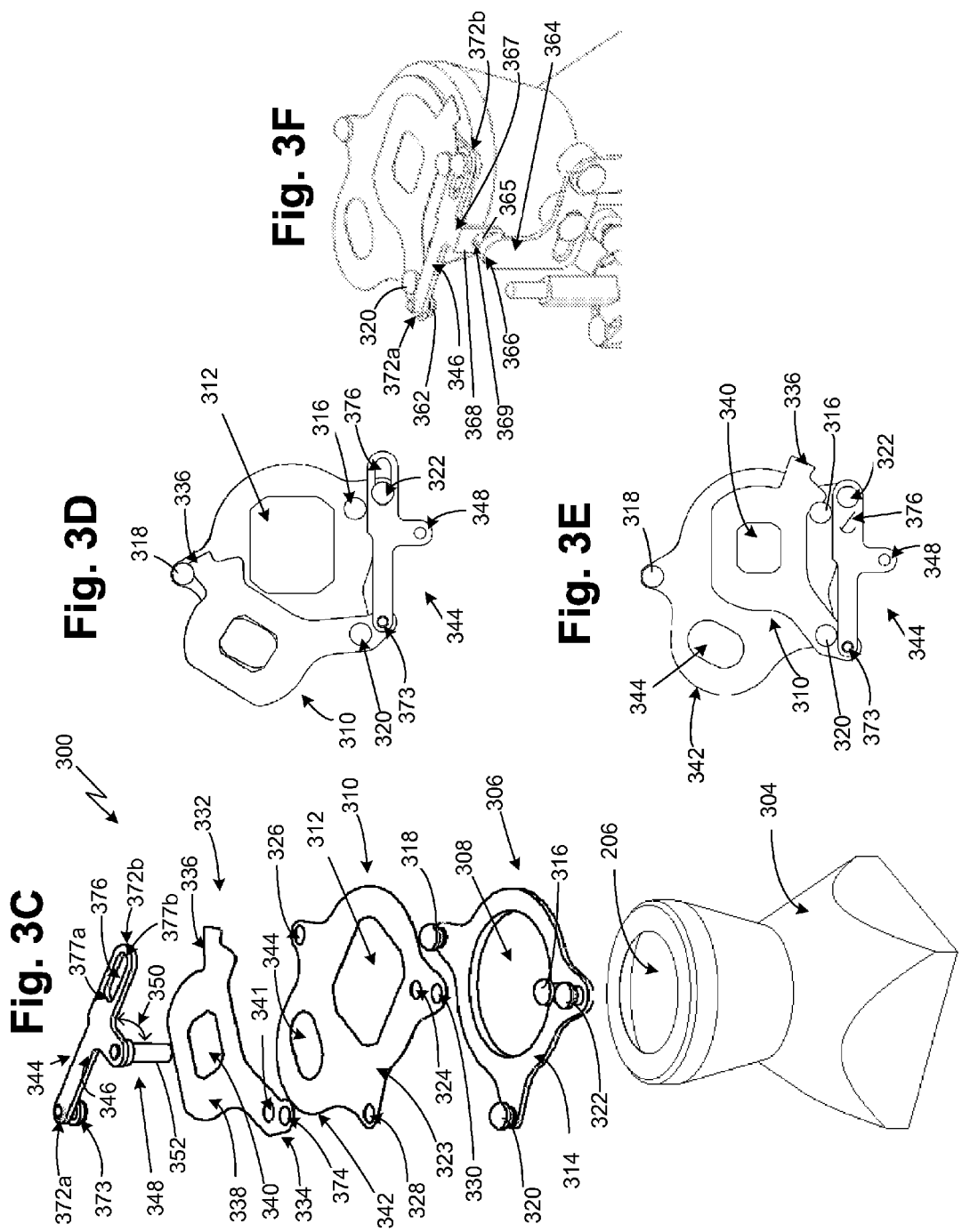

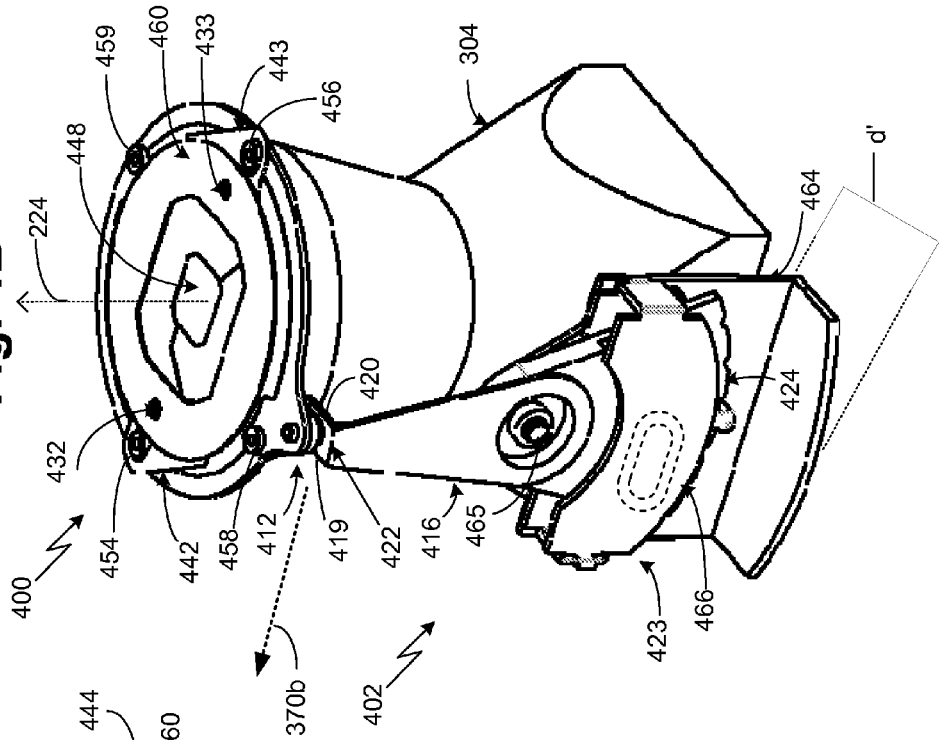
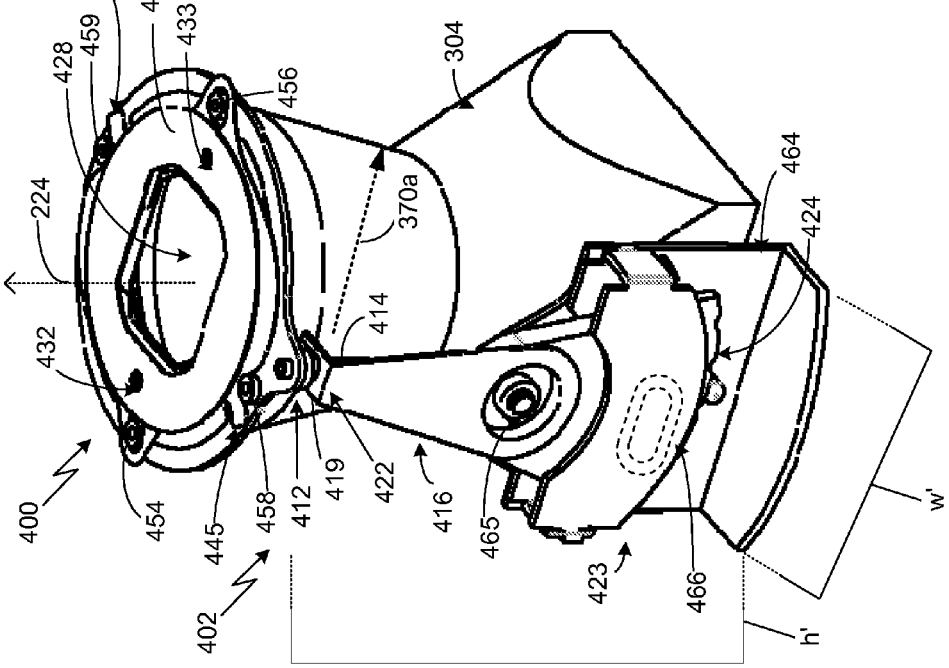

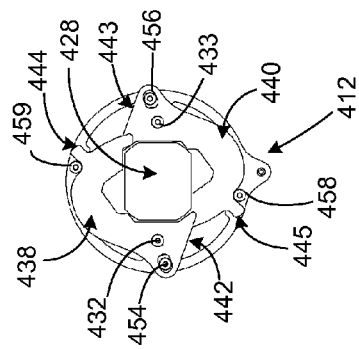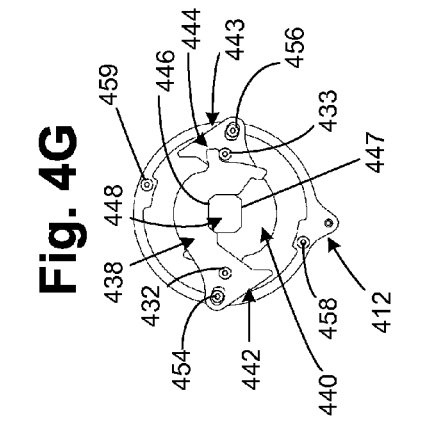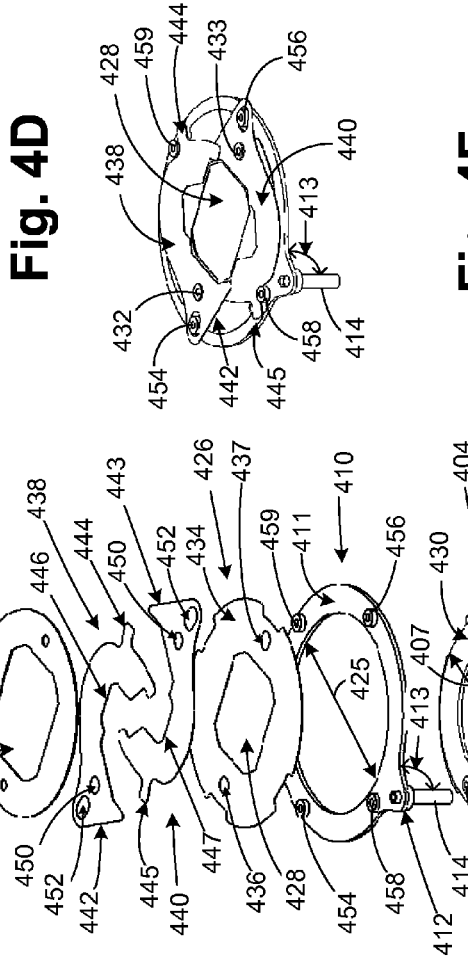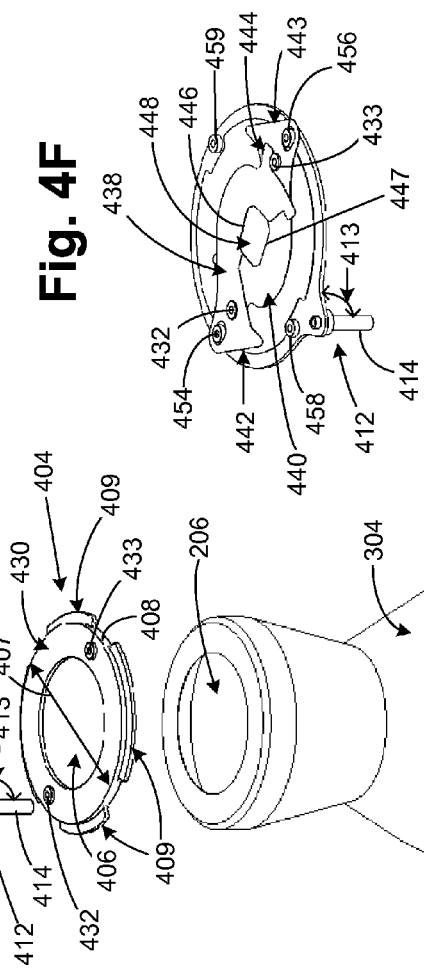

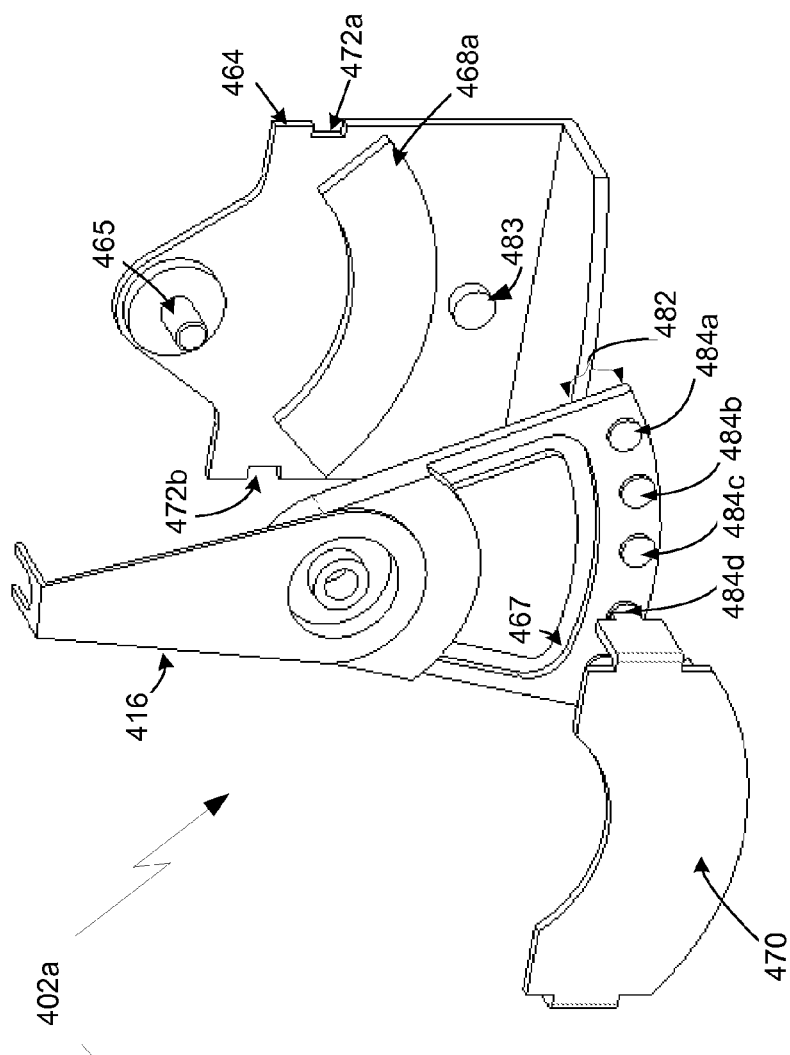
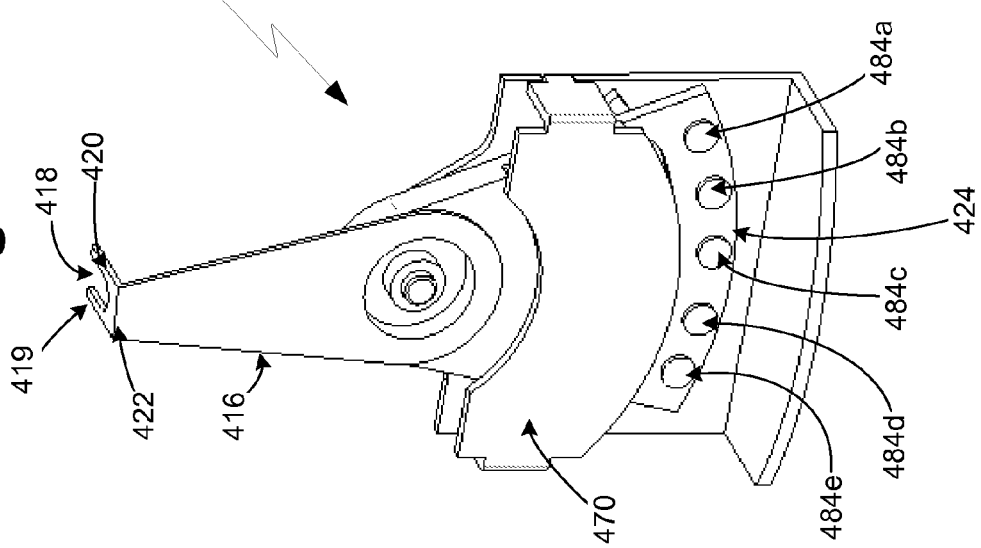

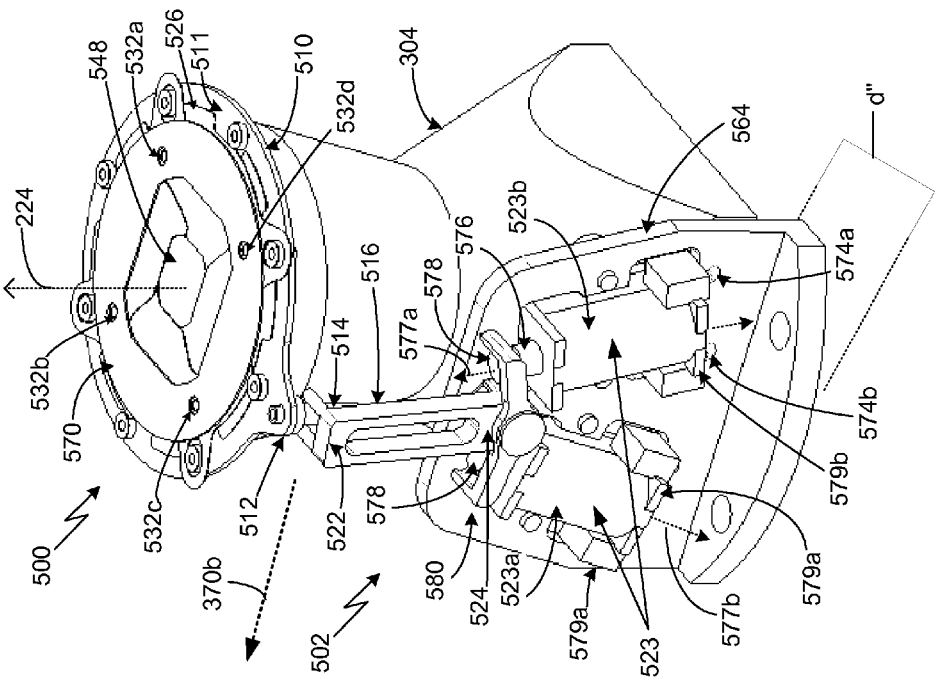
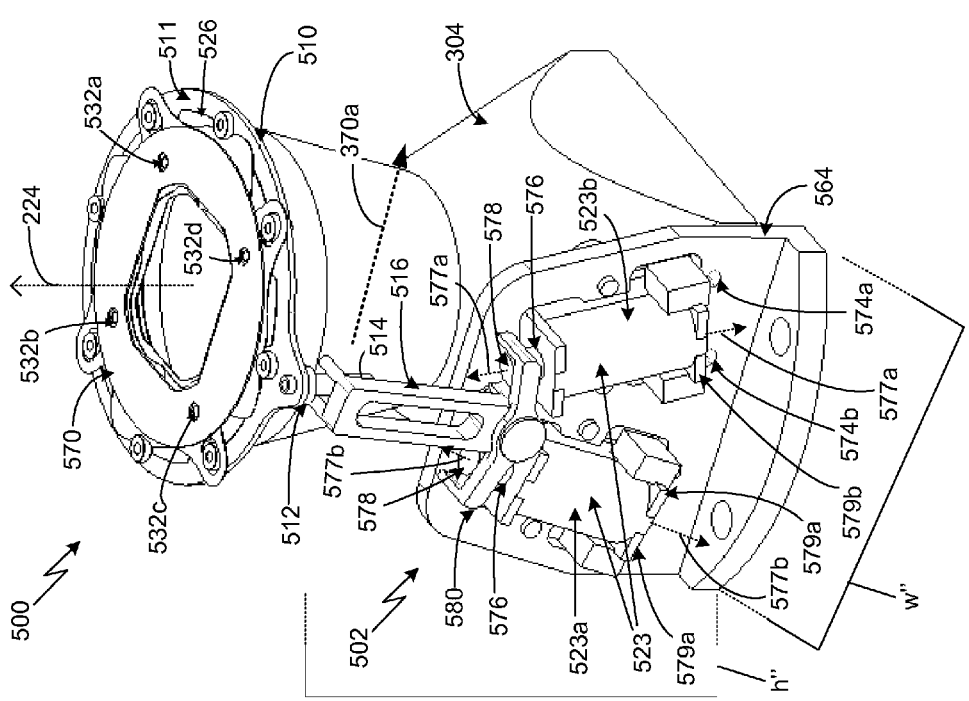

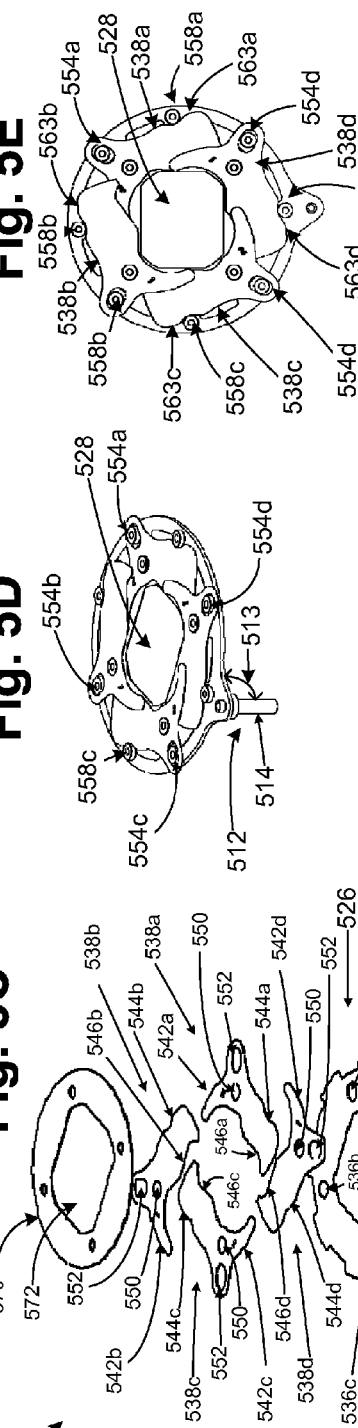
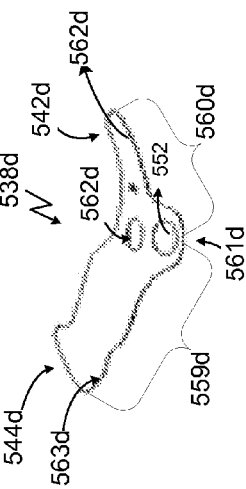
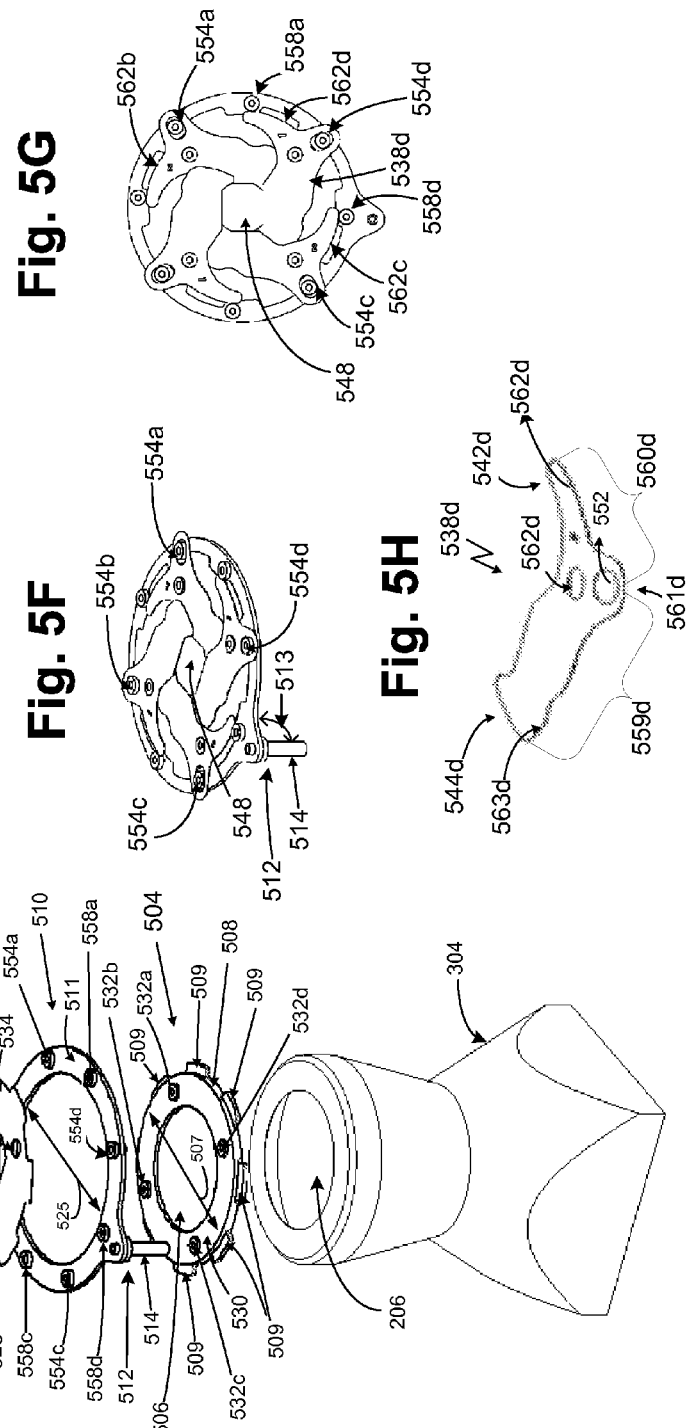
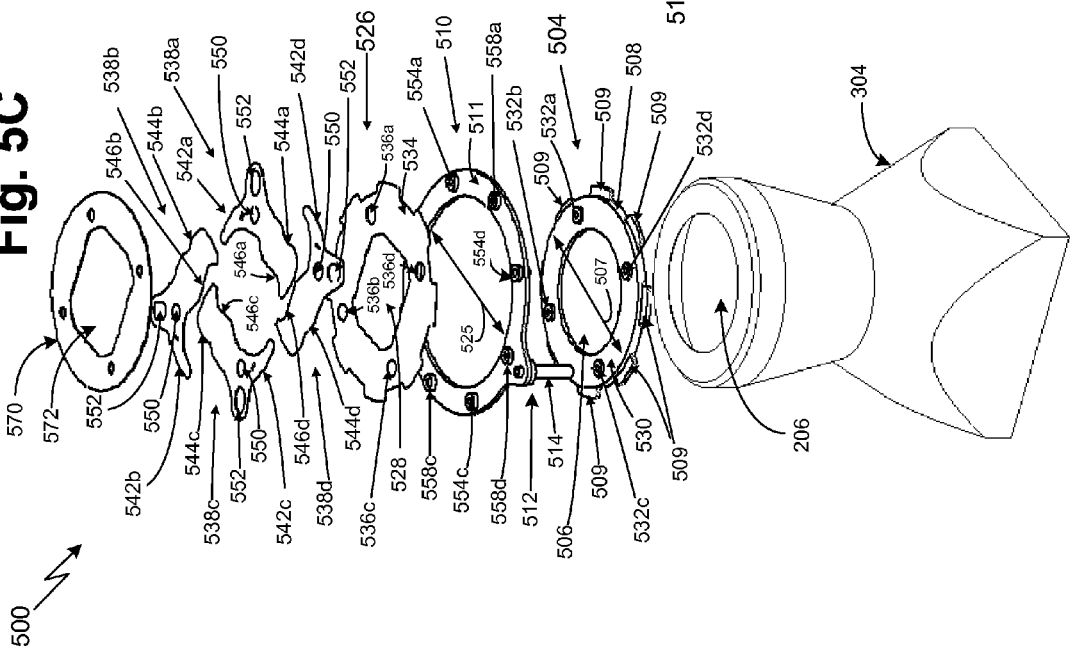

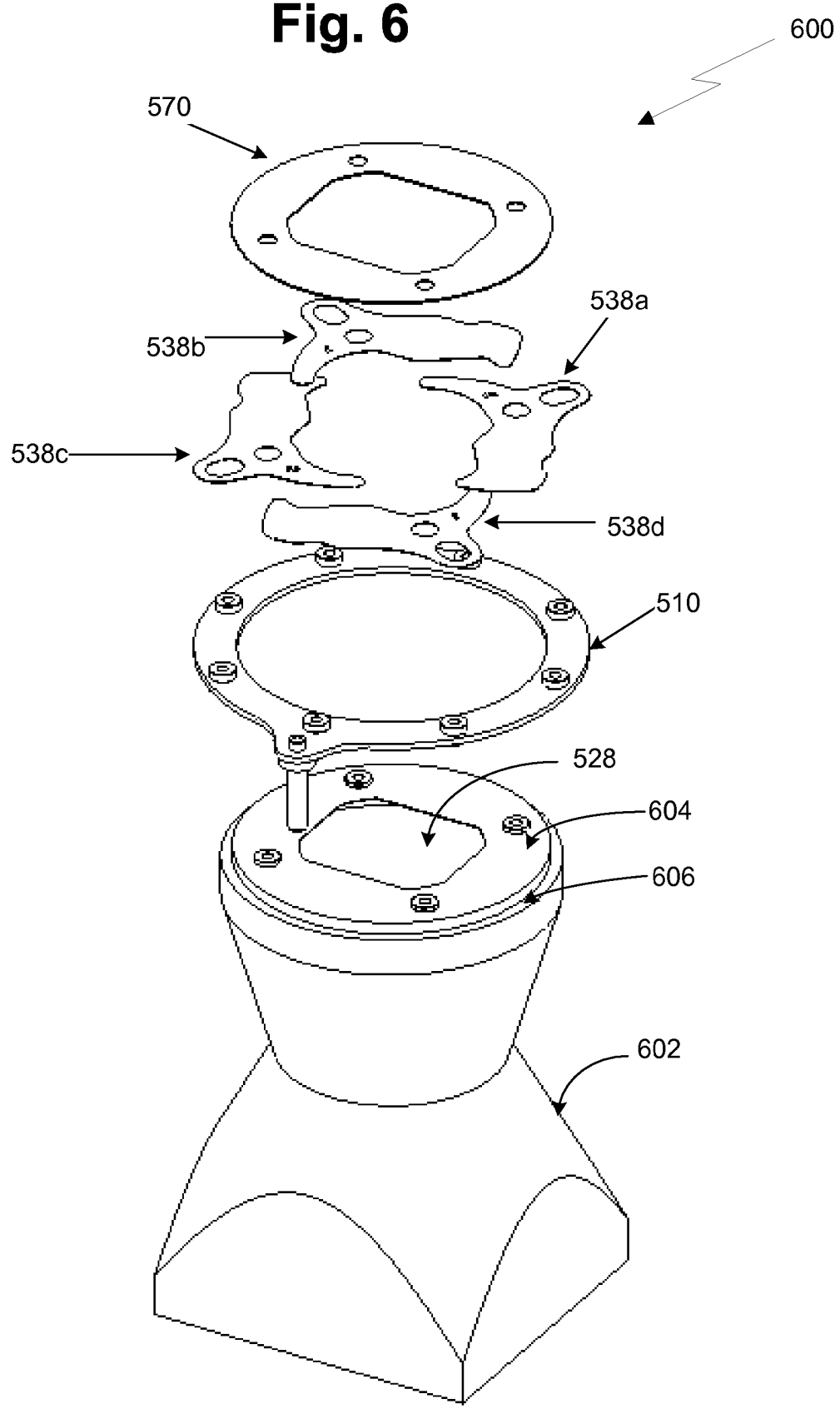

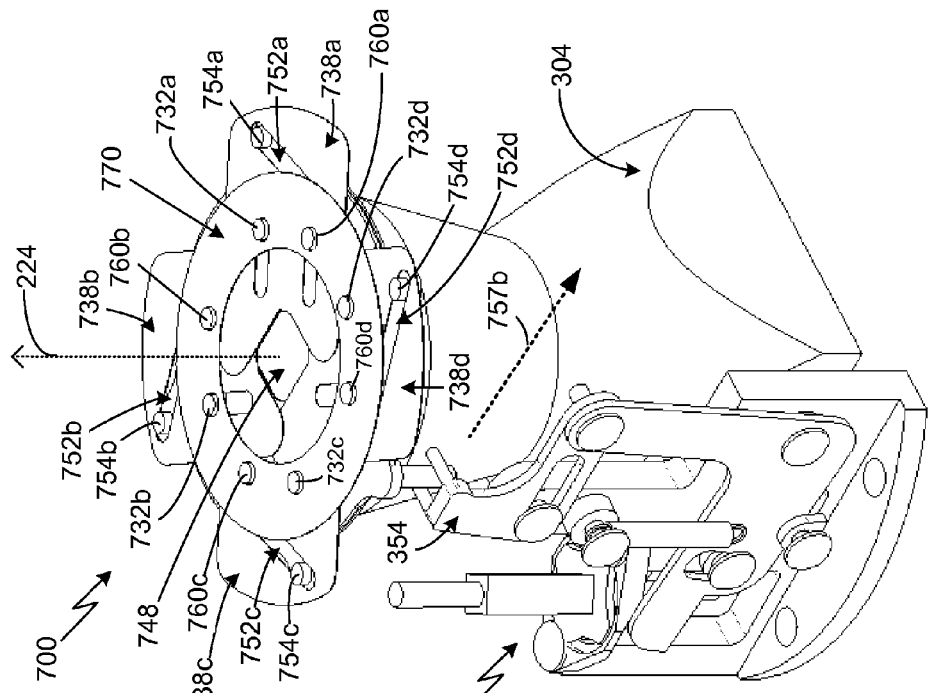

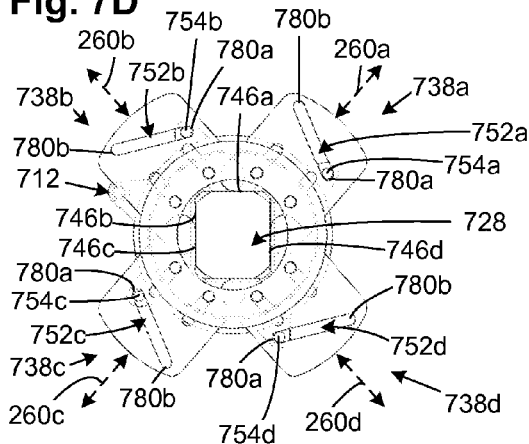
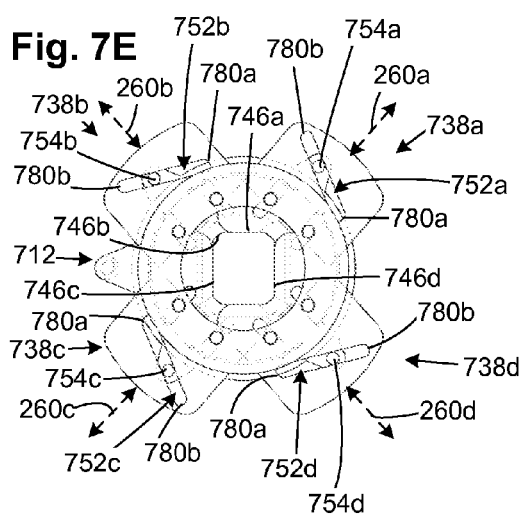
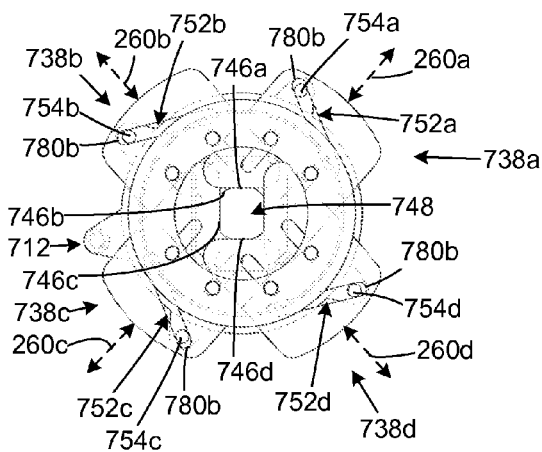
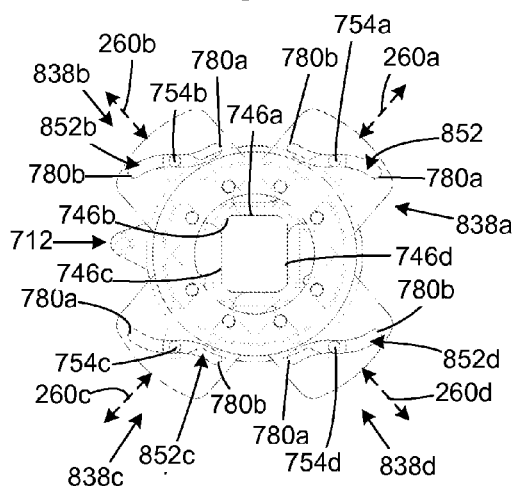
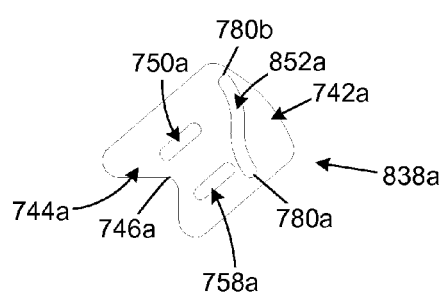

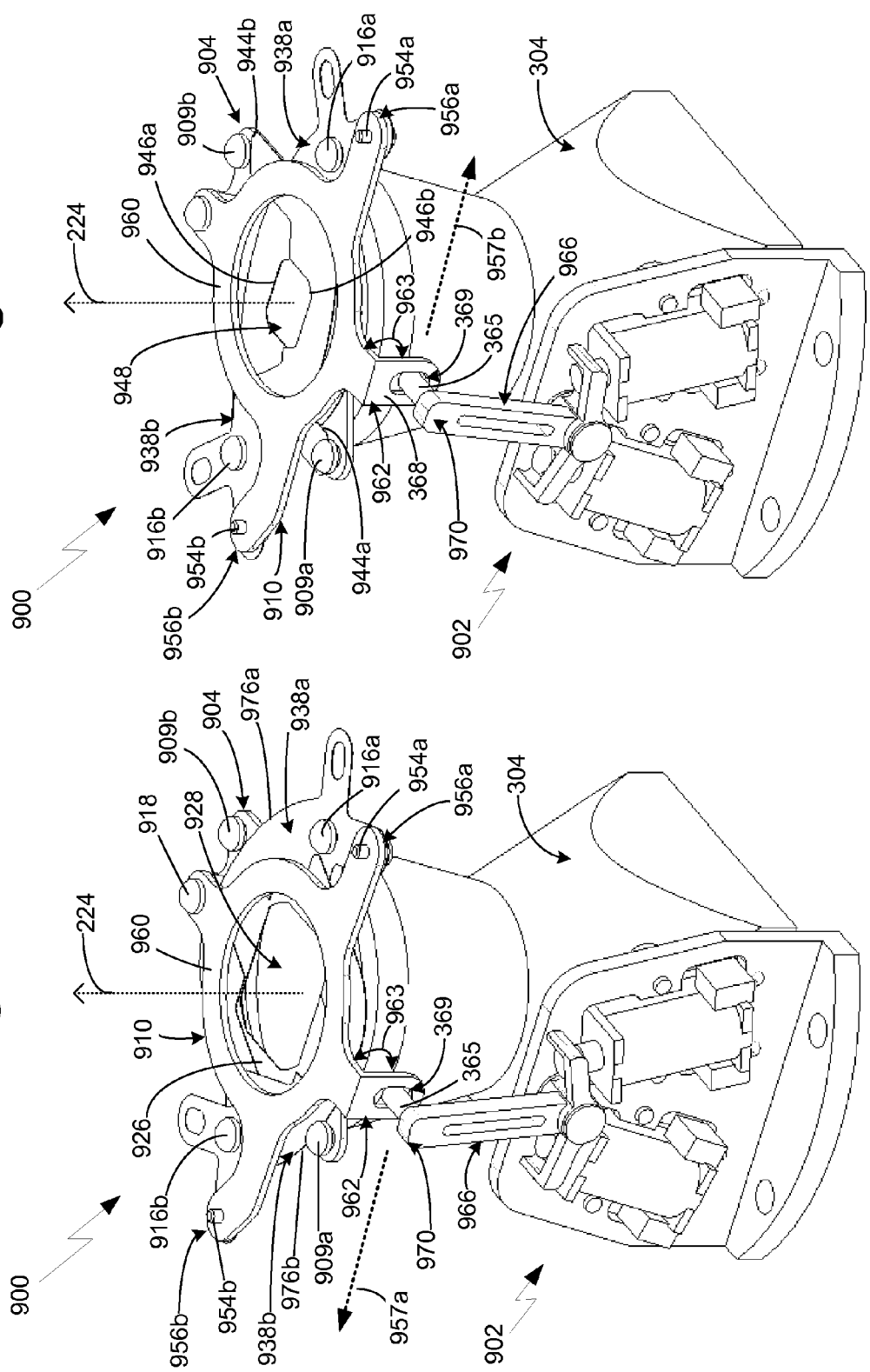

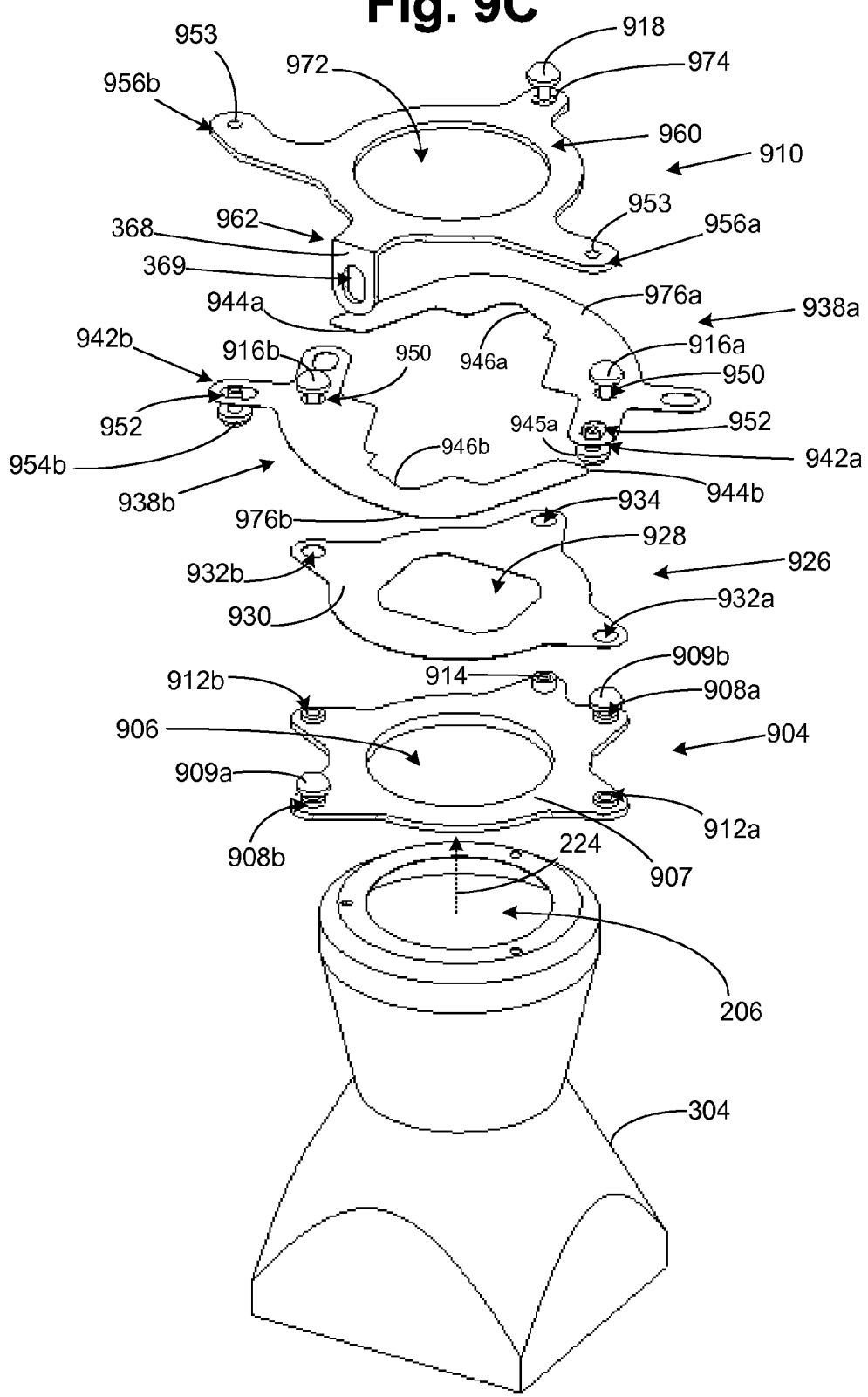

VARIABLE APERTURE AND ACTUATOR ASSEMBLIES FOR AN IMAGING SYSTEM

CROSS-REFERENCES TO RELATED APPLICATIONS

This application is a continuation of U.S. patent application Ser. No. 13/914,398, entitled "VARIABLE APERTURE AND ACTUATOR ASSEMBLIES FOR AN IMAGING SYSTEM," filed on Jun. 10, 2013, which is a continuation of U.S. patent application Ser. No. 12/785,695, now U.S. Pat. No. 8,474,721, entitled "VARIABLE APERTURE AND ACTUATOR ASSEMBLIES FOR AN IMAGING SYSTEM," filed on May 24, 2010 and issued on Jul. 2, 2013, which is a continuation of U.S. patent application Ser. No. 11/761,161, now U.S. Pat. No. 7,724,412, entitled "VARIABLE APERTURE AND ACTUATOR ASSEMBLIES FOR AN IMAGING SYSTEM," filed on Jun. 11, 2007 and issued on May 25, 2010, the disclosures of which are hereby incorporated by reference for all purposes.

FIELD OF THE INVENTION

The present invention relates to imaging systems, more particularly, to variable aperture assemblies and corresponding actuator assemblies for use in an imaging system having a radiation detector housing, such as a cooled infrared imaging system.

BACKGROUND OF THE INVENTION

Thermal infrared radiation (IR) is emitted from all objects as a function of their temperature. IR imaging systems are able to detect thermal signatures and identify target objects by analyzing the heat and profile emitted. The mid-wave and long-wave IR detectors used in IR imaging systems are typically housed in vacuum enclosures, commonly referred to as dewars, and cooled to cryogenic temperatures to improve target detectability and lower signal to noise ratios.

A conventional IR imaging system 100 employing a typical dewar system 102 to cryogenically cool an infrared detector 104 is depicted in FIG. 1. The infrared detector 104 is mounted on a substrate 106 attached to a cold stem 108 of the dewar system 102. The cold stem 108 houses the refrigeration portion of a stirling cycle refrigerator which cools and maintains the detector 104 at cryogenic operating temperatures. The detector 104 is typically mounted within a coldshield 110 that is housed within a vacuum enclosure 112 of the dewar system 102. The vacuum enclosure 112 includes a window 114 attached to the top 116 of the vacuum enclosure 112 that allows the detector 104 to receive radiation signals external to the vacuum enclosure 112. The optics system of the IR imaging system 100 may be incorporated in the window 114 to the vacuum enclosure 112 or be positioned relative to the window 114 in the external housing (not shown in FIG. 1) of the IR imaging system 100.

The coldshield 110 typically includes a fixed aperture 116 that essentially forms the f-stop for the optics system of the IR while also serving as a radiation shield for the detector. Some conventional IR imaging systems are capable of switching between narrow and wide field of view window or optics system (e.g., window 114 or the optics system disposed in the external housing of the IR imaging system 100) to view various target scenes, which requires two different coldshield aperture sizes to effectively match the optics system. A large family of dewars with coldshields of different aperture sizes is currently needed to accommodate the broad range of IR camera system designs. Hence, the need arises for a dewar to have a single coldshield with a variable aperture assembly having two or more apertures that may be switched on command to accommodate the various optical systems that may be employed in an IR imaging system. Moreover, there is a need for an aperture actuator or control means that does not generate a significant amount of heat within the vacuum enclosure when powered on to drive the variable aperture assembly.

U.S. Pat. No. 7,157,706 to Gat et al. discloses variable aperture assemblies (each generally referenced as 122 in FIG. 1) for use in an IR camera having a dewar system 200 with a detector 104 mounted in a coldshield 110 that is enclosed in a vacuum chamber 112 as shown in FIG. 1. However, each non-magnetic driven variable aperture assembly 122 disclosed by Gat requires modifying the vacuum chamber 112 wall to either (1) add an external aperture control means 120, such as a worm gear system to drive a worm gear attached to the variable aperture assembly 122, or (2) to accommodate a piezoelectric motor aperture control means that directly contacts a friction surface of an outer drive ring of the variable aperture assembly 122. These conventional variable aperture assemblies and corresponding aperture control means are known to be extremely large in size (requiring significant space within the vacuum chamber or within the external housing of the IR imaging system) and require significant force and travel to control the size of the variable or swappable aperture to be used.

Accordingly, there is a need for an improved variable aperture assembly and aperture actuator assembly that overcomes the problems noted above and others previously experienced for implementing a variable aperture and actuator within a dewar system of a cooled IR imaging system or camera.

SUMMARY OF THE INVENTION

In accordance with systems consistent with the present invention, an imaging system is provided. The imaging system comprises a housing for a radiation detector (such as a cold shield housing), a variable aperture assembly, and an actuator assembly for the variable aperture. The radiation detector housing has a window disposed above and in axial alignment with the radiation detector. The variable aperture assembly includes a base ring having a first opening and mounted on the radiation detector housing such that the first opening is in axial alignment with the window of the radiation detector housing. The variable aperture assembly also includes a plate and at least one aperture blade (e.g., a single blade, two blades, or four blades) having a first aperture and adapted to engage the base ring such that the first aperture is disposed over the window. Each aperture blade is operatively coupled to the base ring so that the respective aperture blade is adapted to move laterally relative to the first aperture. The variable aperture further includes an aperture drive mechanism having a body and an actuator coupling member extending at an angle from the body. The body is operatively coupled to the base ring and to each aperture blade such that the aperture drive mechanism drives each aperture blade laterally away from the first aperture in response to the actuator coupling member being moved in a first lateral direction, and laterally over the first aperture to define a second aperture disposed over the window in response to the actuator coupling member being moved in a second lateral direction. The actuator assembly is disposed adjacent to the radiation detector housing in proximity to the actuator coupling member. The actuator assembly has an actuator and an actuator arm. The actuator arm has a first end operatively coupled to the actuator and a second end adapted to engage the actuator coupling member of the aperture drive mechanism so that the actuator controls the lateral movement of the actuator coupling member.

In accordance with articles of manufacture consistent with the present invention, a variable aperture assembly for use in an imaging system having a housing for a radiation detector. The housing has a window disposed above and in axial alignment with the radiation detector. The variable aperture assembly comprises a base ring, a plate disposed over the base ring, at least one aperture blade, and an aperture drive mechanism. The base ring has a first opening and is adapted to be mounted on the radiation detector housing such that the first opening is in axial alignment with the window. The plate has a first aperture and is adapted to engage the base ring such that the first aperture is disposed over the window. Each aperture blade is operatively coupled to the base ring so that each aperture blade is adapted to move laterally relative to the first aperture. The aperture drive mechanism has a body and an actuator coupling member extending at an angle from the body. The body is operatively coupled to the base ring and to each aperture blade such that the aperture drive mechanism drives each aperture blade laterally away from the first aperture in response to the actuator coupling member being moved in a first lateral direction, and laterally over the first aperture to define a second aperture disposed over the window in response to the actuator coupling member being moved in a second lateral direction.

In one implementation of the variable aperture assembly, the at least one aperture blade includes a first blade having a first end rotatably coupled at a pivot point to either the base ring or the plate, a second end adapted to be pivoted relative to the first end, and an inner portion disposed between the first and second ends. The inner portion defines the second aperture. The base ring or the plate to which the first blade is rotatably coupled has an upper surface, a first stop pin disposed on the upper surface away from the pivot point, and a second stop pin disposed on the upper surface across the first aperture from the first stop pin and substantially away from the pivot point. The first stop pin is adapted to engage the second end of the first blade to stop the lateral movement thereof when the first blade is moved laterally away from the first aperture so that the first aperture is exposed. The second stop pin is adapted to engage the second end of the first blade to stop the lateral movement thereof when the first blade is moved laterally over the first aperture so that the second aperture is disposed over the window.

In another implementation of the variable aperture assembly, the base ring has an outer diameter defining an outer surface and a flange extending from the outer surface. In this implementation, the body of the aperture drive mechanism corresponds to a drive ring adapted to rotate about the base ring in sliding contact with the flange of the base ring. In addition, the base ring may have a plurality of pivot pins circumferentially spaced on the base ring. The drive ring may have a plurality of drive pins circumferentially spaced on the drive ring relative to the pivot pins. In this implementation, the at least one aperture blade corresponds to two or more aperture blades each having a first end and a second end. The first end of each blade has a pivot opening adapted to receive a respective one of the pivot pins and a drive opening adapted to receive a respective one of the drive pins such that the second end of the respective blade is adapted to pivot relative to the first end when the drive ring is rotated about the base ring.

In another implementation of the variable aperture assembly, the drive ring has a plurality of stop pins circumferentially spaced on the drive ring such that each drive pin is disposed between a respective two of the stop pins. Each aperture blade has a top portion and a lower portion that collectively form a substantially L-shape having an external corner. The lower portion includes the first end and has an outer edge. The top portion includes the second end and has an external edge. The pivot opening and the drive opening of each aperture blade are disposed near the external corner. Each stop pin is adapted to engage the external edge of the top portion of a respective one of the aperture blades to stop the lateral movement thereof when the aperture blade is moved laterally away from the first aperture so that the first aperture is exposed. Each stop pin may also be adapted to engage the outer edge of the lower portion of a respective second of the aperture blades to stop the lateral movement thereof when the aperture blade is moved laterally over the first aperture so that the second aperture is disposed over the window.

In another implementation of the variable aperture assembly, the plate has a circular outer edge that defines a rim along an outer perimeter of the base ring and the body of the aperture drive mechanism corresponds to a drive ring adapted to rotate about the outer edge of the plate in sliding contact with the rim of the base ring. The plate has a first plurality of guide pins circumferentially spaced on the plate. The drive ring has a plurality of drive pins circumferentially spaced on the drive ring relative to the guide pins. In this implementation, the at least one aperture blade corresponds to two or more aperture blades. Each aperture blade has a first guide pin track running in a direction substantially parallel to a corresponding radial axis of the window, and a drive pin track running in a direction substantially diagonal to the first guide pin track of the aperture blade. Each of the plurality of drive pins is operatively coupled to the drive pin track of a corresponding one of the aperture blades such that each drive pin travels along the drive pin track of the corresponding aperture blade in response to the drive ring being rotated about the outer edge of the plate. Each of the first plurality of guide pins is operatively coupled to the first guide pin track of a corresponding one of the aperture blades such that each first guide pin travels along the first guide pin track of the corresponding aperture blade in response to the drive pin traveling along the drive pin track of the corresponding aperture blade.

In accordance with articles of manufacture consistent with the present invention, an aperture actuator assembly for use in actuating a variable aperture assembly disposed over a window of radiation detector housing in an imaging device is provided. The variable aperture assembly includes an aperture drive mechanism having a body and an actuator coupling member extending down at an angle from the body. The actuator coupling member is adapted to be moved in a first lateral direction so that the variable aperture assembly defines a first aperture over the window and in a second lateral direction so that the variable aperture assembly defines a second aperture over the window. The aperture actuator assembly comprises an actuator adapted to be disposed adjacent to the radiation detector housing below the actuator coupling member, and an actuator arm disposed between the actuator and the actuator coupling member. The actuator arm has a first end operatively coupled to the actuator and a second end adapted to engage the actuator coupling member of the aperture drive mechanism so that the actuator controls the lateral movement of the actuator coupling member.

In one implementation of the aperture actuator assembly, the actuator is a piezoelectric motor having an actuator rod operatively coupled to the first end of the actuator arm and adapted to be selectively moved between a first position to cause the actuator arm to move in the first lateral direction and a second position to enable the actuator arm to move in the second lateral direction.

In another implementation of the aperture actuator assembly, the aperture actuator assembly also includes a mounting bracket extending vertically relative to the radiation detector housing. The actuator arm is pivotally coupled to the mounting bracket such that the second end of the actuator arm is adapted to rotate in the first lateral direction and the second lateral direction. The actuator comprises a magnet and a voice coil motor having a wire coil operatively configured to receive a drive current. The wire coil is incorporated in the first end of the actuator arm and the magnet is disposed relative to the wire coil so that the magnet drives the first end of the actuator arm away from the magnet in a predetermined direction in response to the drive current flowing through the wire coil. The predetermined direction corresponds to one of the first lateral direction and the second lateral direction based on a direction of flow of the drive current through the wire coil.

In another implementation of the aperture actuator assembly, the actuator assembly further comprises a mounting bracket extending vertically relative to the radiation detector housing. The actuator arm is pivotally coupled to the mounting bracket such that the second end of the actuator arm is adapted to rotate in the first lateral direction and the second lateral direction. The actuator comprises an electromagnetic solenoid having a drive input and a piston adapted to move along a longitudinal axis of the solenoid between an extended position and a contracted position based on the drive input. The piston has an end operatively coupled to the first end of the actuator arm so that the piston drives the second end of the actuator arm in the first lateral direction when moving towards the extended position and in the second lateral direction when moving towards the contracted position.

Other systems, methods, features, and advantages of the present invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings:

FIG. 3C is an exploded view of the variable aperture assembly depicted in FIGS. 3A and 3B;

FIG. 3D is a top view of the variable aperture assembly in which the second aperture of the single blade is shown in the first position as depicted in FIG. 3A;

FIG. 3E is another top view of the variable aperture assembly in which the second aperture of the single blade is shown in the second position as depicted in FIG. 3B;

FIG. 3F is a perspective view of an alternative aperture drive mechanism for the variable aperture assembly and a corresponding alternative actuator arm for the aperture actuator assembly in FIGS. 3A and 3B;

FIGS. 4A and 4B are perspective views of a second embodiment of a variable aperture assembly and a second embodiment of a corresponding aperture actuator assembly suitable for implementing the present invention in the infrared imaging system in FIG. 2, where the variable aperture assembly includes a fixed plate having a first aperture as shown in FIG. 4A and two aperture blades operatively configured to define a second aperture over the first aperture when moved via the aperture actuator assembly as shown in FIG. 4B;

FIG. 4C is an exploded view of the variable aperture assembly depicted in FIGS. 4A and 4B;

FIG. 4D is a perspective view of the variable aperture assembly as depicted in FIG. 4A, where a cover ring of the variable aperture assembly has been removed to provide a more complete view of the arrangement of the two blades when moved via the aperture actuator assembly to expose the first aperture of the fixed plate;

FIG. 4E is a top view of the variable aperture assembly as depicted in FIG. 4D;

FIG. 4F is a perspective view of the variable aperture assembly as depicted in FIG. 4B, where the cover ring has been removed to provide a more complete view of the arrangement of the two blades when moved via the aperture actuator assembly to define the second aperture over the first aperture;

FIG. 4G is a top view of the variable aperture assembly as depicted in FIG. 4F;

FIG. 4I is a perspective view of another implementation (or third embodiment) of a aperture actuator assembly suitable for implementing the present invention in the infrared imaging system in FIG. 2;

FIG. 4J is an exploded view of the aperture actuator assembly depicted in FIG. 4I;

FIGS. 5A and 5B are perspective views of a third embodiment of a variable aperture assembly and a fourth embodiment of a corresponding aperture actuator assembly suitable for implementing the present invention in the infrared imaging system in FIG. 2, where the variable aperture assembly includes a fixed plate having a first aperture as shown in FIG. 5A and four aperture blades operatively configured to define a second aperture over the first aperture when moved via the aperture actuator assembly as shown in FIG. 5B;

FIG. 5C is an exploded view of the variable aperture assembly depicted in FIGS. 5A and 5B;

FIG. 5D is a perspective view of the variable aperture assembly as depicted in FIG. 5A, where a cover ring of the variable aperture assembly has been removed to provide a more complete view of the arrangement of the four aperture blades when moved via the aperture actuator assembly to expose the first aperture of the fixed plate;

FIG. 5E is a top view of the variable aperture assembly as depicted in FIG. 5D;

FIG. 5F is a perspective view of the variable aperture assembly as depicted in FIG. 5D, where the cover ring has been removed to provide a more complete view of the arrangement of the four aperture blades when moved via the aperture actuator assembly to define the second aperture over the first aperture;

FIG. 5G is a top view of the variable aperture assembly as depicted in FIG. 5F;

FIG. 5H is an enlarged view of one of the aperture blades of the variable aperture assembly depicted in FIGS. 5A and 5B;

FIG. 6 is an exploded view of another implementation (or fourth embodiment) of the variable aperture assembly shown in FIGS. 5A-5G, where the fixed plate has been incorporated into a base ring of the variable aperture assembly and the base ring has been incorporated into a window of a radiation detector housing for the infrared imaging system;

FIGS. 7A and 7B are perspective views of a fifth embodiment of a variable aperture assembly suitable for implementing the present invention, where the variable aperture assembly has four aperture blades operatively configured to be selectively adjusted via an aperture actuator assembly consistent with the present invention so as to vary an aperture defined by the aperture blades between a first size shown in FIG. 7A and a second size shown in FIG. 7B;

FIG. 7D is a top view of the variable aperture assembly as depicted in FIG. 7A;

FIG. 7E is another top view of the variable aperture assembly depicted in FIGS. 7A & 7B in which the aperture blades have been adjusted via the aperture actuator assembly so that the aperture defined by the aperture blades has a corresponding size that is smaller than the first size shown in FIG. 7A and larger than the second size shown in FIG. 7B;

FIG. 7F is a top view of the variable aperture assembly as depicted in FIG. 7B;

FIG. 8A is a top view of another implementation (or sixth embodiment) of the variable aperture assembly shown in FIGS. 7A-7G, where each aperture blade of the variable aperture assembly has an S-track or non-linear track for controlling the movement of the respective aperture blade and the size of the aperture collectively defined by each of the blades;

FIG. 8B is a top view of one of the aperture blades of the variable aperture assembly shown in FIG. 8A;

FIGS. 9A and 9B are perspective views of a seventh embodiment of a variable aperture assembly and a fifth embodiment of a corresponding aperture actuator assembly suitable for implementing the present invention in the infrared imaging system in FIG. 2, where the variable aperture assembly includes a fixed plate having a first aperture as shown in FIG. 9A and two aperture blades operatively configured to define a second aperture over the first aperture when moved via the aperture actuator assembly as shown in FIG. 9B; and FIG. 9C is an exploded view of the variable aperture assembly depicted in FIGS. 9A and 9B.

DETAILED DESCRIPTION OF THE INVENTION

Reference will now be made in detail to an implementation in accordance with methods, systems, and products consistent with the present invention as illustrated in the accompanying drawings.

Figure 1:
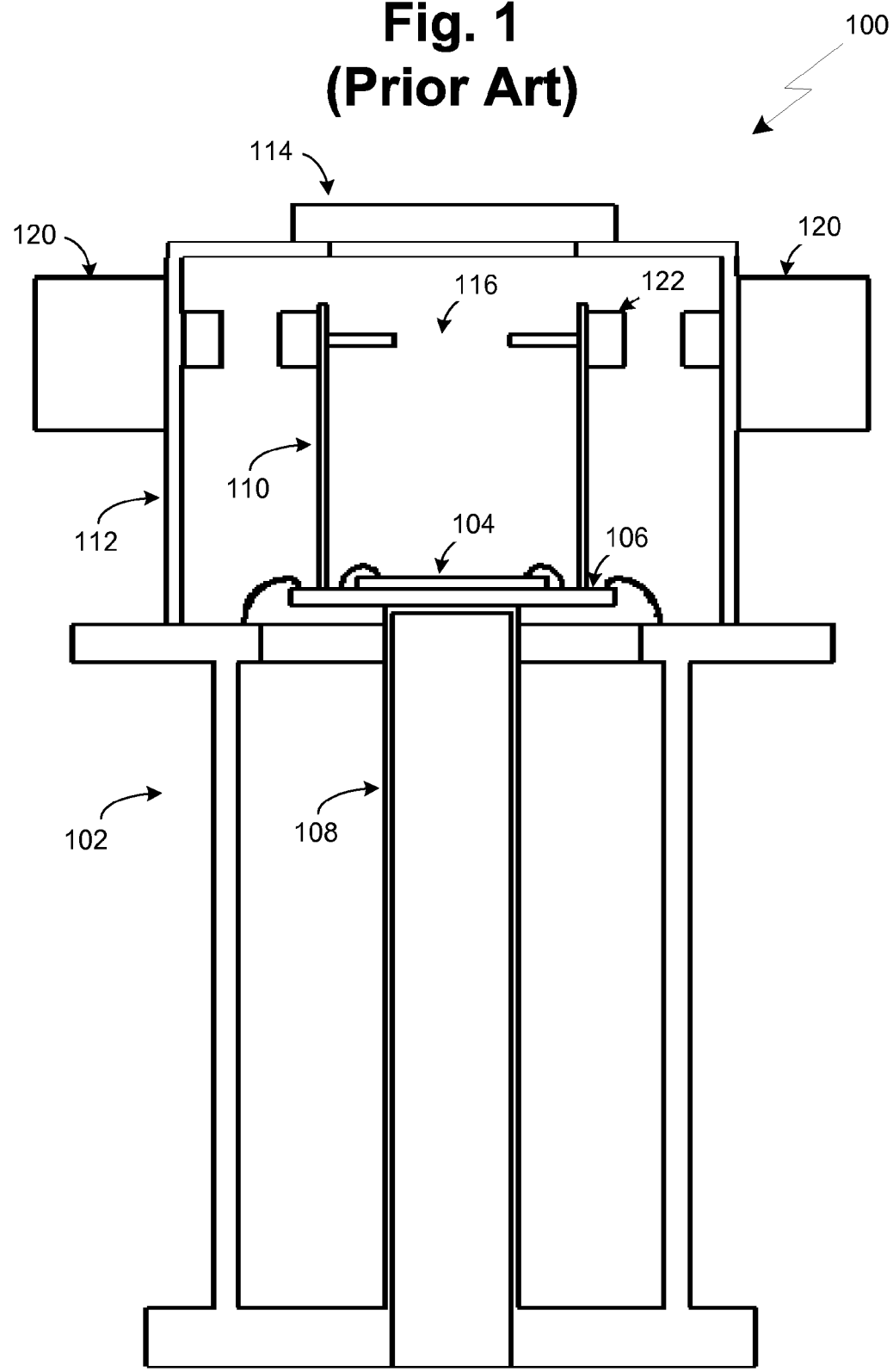
FIG. 1 is a schematic cross-sectional view of a conventional cooled conventional infrared imaging system having a radiation detector mounted within a radiation shield enclosed within a vacuum chamber, where the radiation shield has a variable aperture and a control means for the variable aperture is mounted external to the vacuum chamber.
Figure 2:
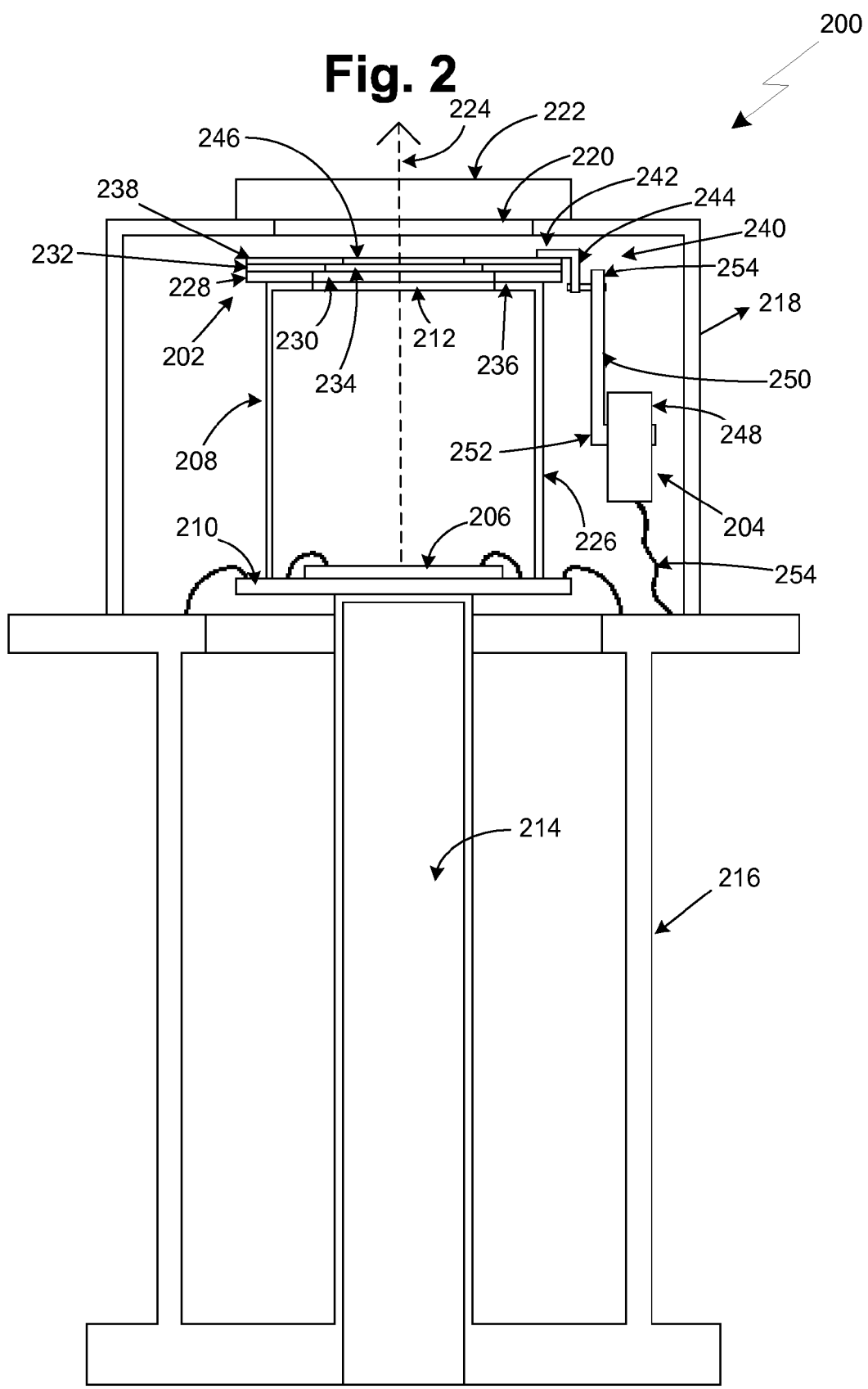
FIG. 2 is a schematic cross-sectional view of an exemplary infrared imaging system employing a variable aperture assembly and an aperture actuator assembly consistent with the present invention.

FIG. 2 depicts a schematic cross-sectional view of an exemplary infrared imaging system 200 employing a variable aperture assembly 202 and an aperture actuator assembly 204 consistent with the present invention. The variable aperture assembly 202, which has a low profile and low mass, is operatively configured to selectively switch between two or more apertures of different size so that the selected aperture is accurately positioned relative to a radiation detector 206 housed within the infrared imaging system 200. The aperture actuator assembly 204 also has low mass, a compact profile, and a low power actuator that has limited thermal radiation output suitable for operation in a vacuum environment.

As shown in FIG. 2, the infrared imaging system 200 includes a housing 208 for the radiation detector 206, which may be one or more pixels in a focal plane array mounted on a substrate 210. The housing 208 has an aperture or window 212 having a fixed size. The window 212 may be an opening in the housing 208 with or without a transparent material adapted to permit radiation outside the housing 208 within the field of view of the window 212 to enter the housing 208. The window 212 is disposed above and in axial alignment with the radiation detector 206. In the implementation shown in FIG. 2, the housing 208 is a cold shield or radiation shield that is (along with the substrate 210) attached to a cold stem 214 of a dewar system 216. In this implementation, the infrared imaging system 200 also includes a vacuum chamber 218 that encloses the radiation detector housing 208. The vacuum chamber 218 has a sealed window 220 over which a variable or fixed lens 222 may be mounted. The cold stem 214 effectively cools and maintains the temperature of the housing 208 and the radiation detector 206. However, the variable aperture assembly 202 and the aperture actuator assembly 204 as described herein may be employed in an uncooled imaging system without departing from the present invention.

In the implementation shown in FIG. 2, the radiation detector 206 and the housing's window 212 are centrally aligned with each other along a longitudinal or vertical axis 224 of the housing. The variable aperture assembly 202 is mounted over and axially aligned with the housing's window 212. The aperture actuator assembly 204 is disposed adjacent to and extending vertically along a side 226 of the radiation detector housing 208 and below the variable aperture assembly 202. Although the aperture actuator assembly 204 may employ different actuators as described herein, the aperture actuator assembly 204 has a compact profile, with a volume (e.g., width, height, and depth shown as w, h and d in FIGS. 3A-B, w', h' and d' in FIGS. 4A-4B, and w", h", and d" in FIGS. 5A-5B) within a range from 13 cubic mm to 3750 cubic mm based on a width (i.e., w, w' or w") ranging from 1.5 mm to 25 mm, a height (i.e., h, h' or h") ranging from 1.5 mm to 25 mm, and a depth of approximately 6 mm. The compact profile of the aperture actuator assembly 204 enables the aperture actuator assembly 204 to engage and actuate the variable aperture assembly 202 while disposed and operating in the vacuum chamber 218 of the imaging system 200.

Various embodiments of the variable aperture assembly 202 consistent with the present invention are described herein. Each variable aperture assembly 202 (300 in FIGS.

3A-3F, 400 in FIGS. 4A-4G, 500 in FIGS. 5A-5H, 600 in FIG. 6, 700 in FIGS. 7A-7F, 800 in FIGS. 8A-8F, and 900 in FIGS. 9A-9C) may include a base ring 228 (306 in FIG. 3C, 404 in FIG. 4C, 504 in FIG. 5C, 604 in FIG. 6, 704 in FIG. 7C, or 904 in FIG. 9C) having a first opening 230 (308 in FIG. 3C, 406 in FIG. 4C, 506 in FIG. 5C, 706 in FIG. 7C or 906 in FIG. 9C) and mounted on the radiation detector housing 208 such that the first opening 230 is in axial alignment with the window 212 of the housing 208. Each variable aperture assembly may include a plate 232 (310 in FIG. 3C, 426 in FIG. 4C, 526 in FIG. 5C, 726 in FIG. 7C or 926 in FIG. 9C) having a first aperture 234 (312 in FIG. 3C, 428 in FIG. 4C, 528 in FIG. 5C, 728 in FIG. 7C or 928 in FIG. 9C) of a fixed size, where the plate 232 is mounted to and/or adapted to engage the base ring 228 such that the first aperture 234 is disposed over and in axial alignment with the housing's window 212. As discussed in reference to FIG. 6, the plate 232 may be incorporated into the base ring 228 and the base ring 228 affixed or incorporated into the top 236 of the radiation detector housing 208 so that the housing window 212 corresponds to the first aperture 234.

Figure 7C:
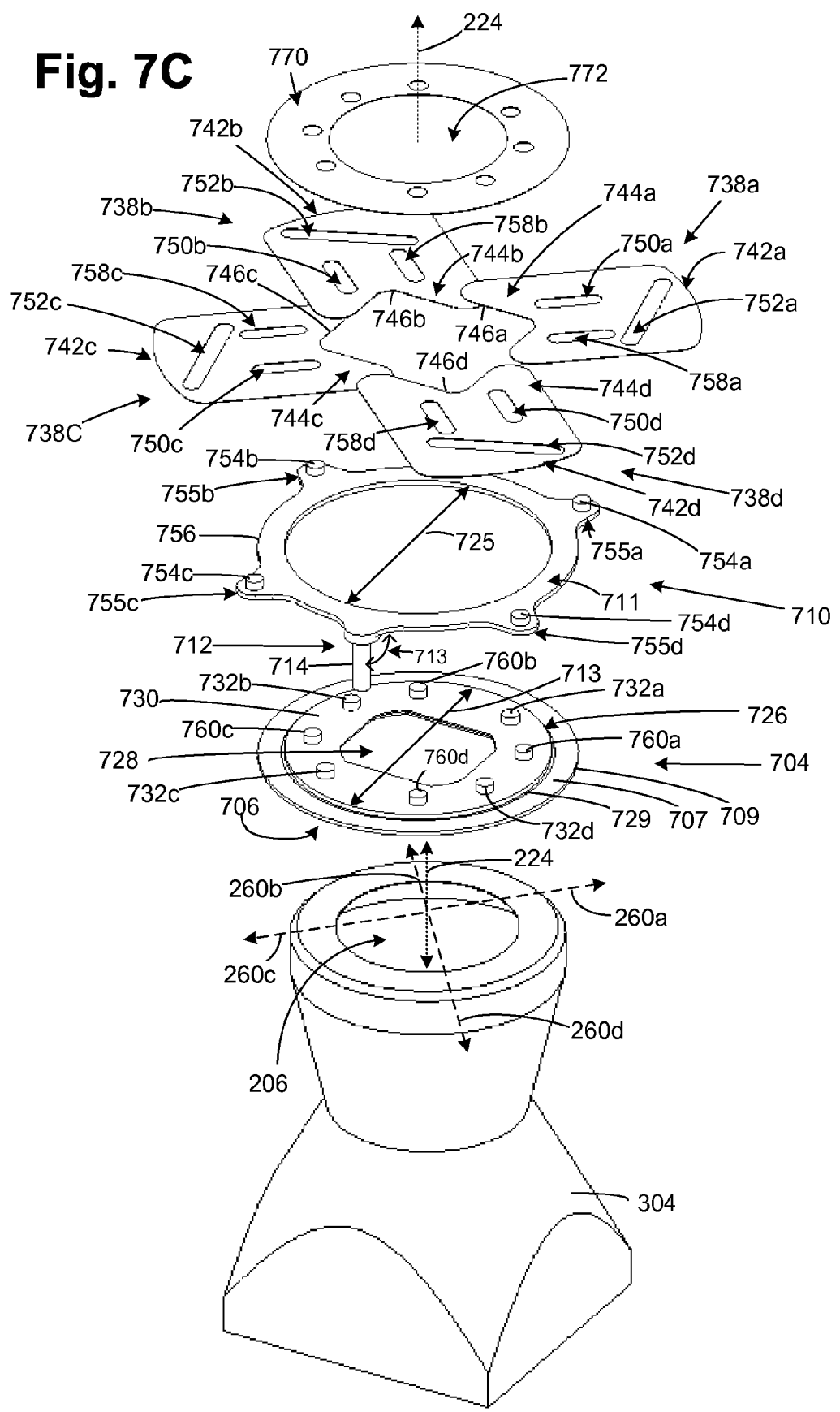
FIG. 7C is an exploded view of the variable aperture assembly depicted in FIGS. 7A and 7B.

Each variable aperture assembly also has one or more aperture blades 238 (332 in FIG. 3C, 438 and 440 in FIG. 4C, 538a-538b in FIG. 5C, 738a-738b in FIG. 7C, 838a-838b in FIG. 8C or 938a-938b in FIG. 9C) and an aperture drive mechanism 240 (334 in FIG. 3C, 410 in FIG. 4C, 510 in FIG. 5C, 710 in FIG. 7C or 910 in FIG. 9C). As explained in further detail below, each aperture blade 238 is operatively coupled to the base ring 228 or plate 232 so that the respective aperture blade 238 is adapted to move laterally relative to the first aperture 234. The aperture drive mechanism 240 has a body 242 and an actuator coupling member 244 extending at an angle from the body 242, allowing the actuator assembly 204 to be disposed next to (or abut) the radiation detector housing 208 and within the vacuum chamber 218.

As described in further detail below, the body 242 of the aperture drive mechanism 240 is operatively coupled to the base ring 228 (or the plate 232 having the first aperture 234) and to each aperture blade 238 such that the aperture drive mechanism 240 drives each aperture blade 238 laterally away from the first aperture 234 in response to the actuator coupling member 244 being moved in a first lateral direction (e.g., direction reflected by arrow 370a in FIGS. 3A, 4A and 5A, arrow 757a in FIG. 7A, or arrow 957a in FIG. 9A), and laterally over the first aperture 234 to define a second aperture 246 disposed over the radiation detector housing window 212 in response to the actuator coupling member 244 being moved in a second lateral direction (e.g., direction reflected by arrow 370b in FIGS. 3B, 4B and 5B, arrow 757b in FIG. 7B, or arrow 957b in FIG. 9B).

Various embodiments of the aperture actuator assembly 204 consistent with the present invention are also described herein. Each actuator assembly 204 (302 in FIGS. 3A-3B, 402 in FIGS. 4A-4B and 4H, 402a in FIGS. 4I-4J, 502 in FIGS. 5A-5B and 5I, and 902 in FIGS. 9A-9B) may be employed in accordance with the present invention to drive any one of the variable aperture assemblies 202, 300, 400, 500, 600, 700, 800, and 900. As discussed in further detail below, each actuator assembly has an actuator 248 (380 in FIGS. 3A-3B, 3F and 7A-7B, 402 in FIGS. 4A-4B and 4H, 402a in FIGS. 4I-4J, 502 in FIGS. 5A-5B and 5I, and 902 in FIGS. 9A-9B) and an actuator arm 250 (354 in FIGS. 3A-3B and 7A-7B, 364 in FIG. 3F, 416 in FIGS. 4A-4B and 4H-4J, 516 in FIGS. 5A-5B and 5I, and 966 in FIGS. 9A-9B). The actuator arm 250 has a first end 252 operatively coupled to the actuator 248 and a second end 254 adapted to engage the actuator coupling member 244 of the aperture drive mechanism 240 so that the actuator 248 controls the lateral movement of the actuator coupling member 244. The actuator 248 of each actuator assembly 204 includes one or more interconnects 254 to route power inputs signals (e.g., a drive input signal or current and a return input signal or current for the actuator 248) and other signals between the respective actuator 248 and a drive motor or a backend processor (not shown in figures) which may be disposed external to the vacuum chamber 218 of the imaging system 200.

Figure 3A:
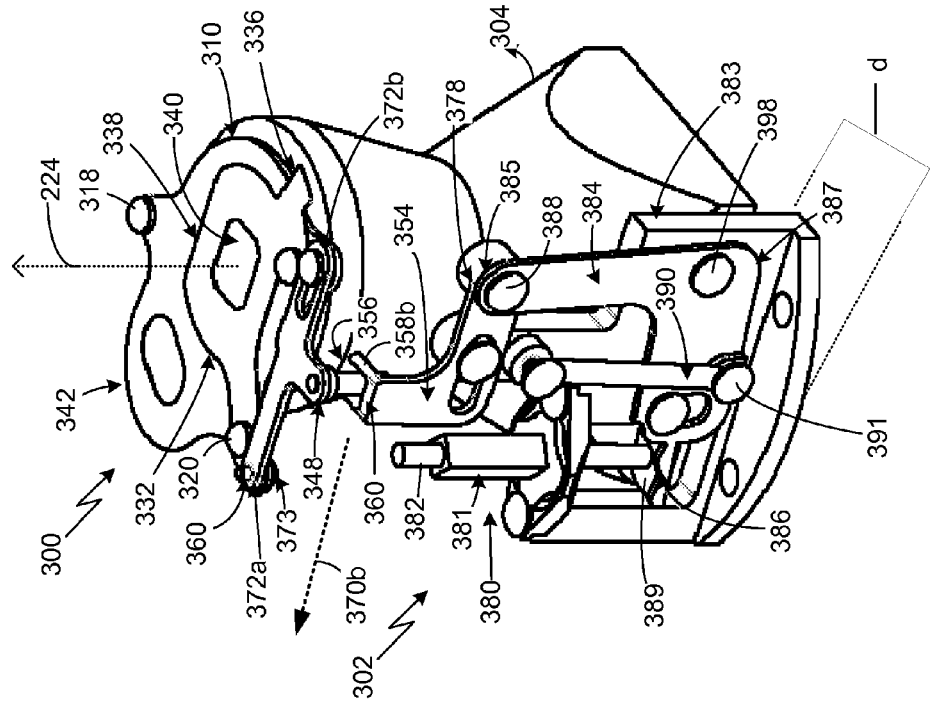
FIG. 3A is a perspective view of one embodiment of a variable aperture assembly and one embodiment of a corresponding aperture actuator assembly suitable for implementing the present invention in the infrared imaging system in FIG. 2, where the variable aperture assembly includes a plate having a first aperture disposed over a window of an exemplary radiation detector housing within the infrared imaging system and a single blade having a second aperture shown in a first position laterally away from the first aperture.
Figure 3B:
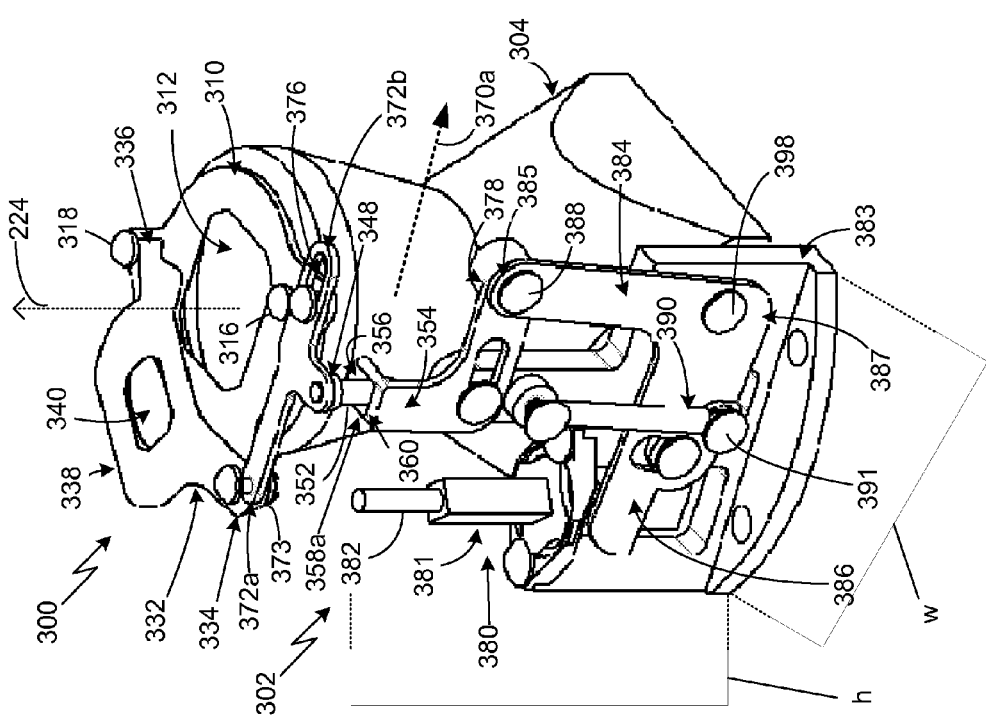
FIG. 3B is another perspective view of the variable aperture assembly and the aperture actuator assembly in FIG. 3A (with a portion of the aperture actuator assembly in partial cut away view), where the single blade has been moved, via the aperture actuator assembly, in accordance with the present invention so that the second aperture is in a second position over the first aperture and the window of the radiation detector housing.

FIGS. 3A-3E depict one embodiment of a variable aperture assembly 300 and FIGS. 3A-3B depict one embodiment of a corresponding aperture actuator assembly 302 suitable for implementing the present invention in the infrared imaging system 200. Components of the imaging system 200, such as the vacuum chamber 218, are not shown in FIGS. 3A-3E to avoid obscuring inventive aspects of the variable aperture assembly 300 and the aperture actuator assembly 302.

The radiation detector housing 304 shown in FIGS. 3A-3C has a hour glass shape but is otherwise consistent with the housing 208 shown in FIG. 2. The radiation detector housing 304 has an aperture or window 206 disposed above and in axial alignment with the radiation detector 206 (not shown in FIGS. 3A-3C). The variable aperture assembly 300 includes a base ring 306 having a first opening 308 and mounted on the radiation detector housing 304 such that the first opening 308 is in axial alignment with the window 206. The base ring 306 may be mounted to the radiation detector housing 304 via epoxy, soldering, or other fastening technique. A plate 310 having a first aperture 312 is engaged or attached to the base ring 306 such that the first aperture 312 is disposed over the window 206. The base ring 306 and the plate 310 may each be comprised of a conductive metal or alloy that allows heat produced by the variable aperture assembly or received from radiation incident on the variable aperture assembly to be dissipated via the housing 304, which may function as a cold shield as previously discussed. In the implementation shown in FIGS. 3A-3E, the base ring 306 has an upper surface 314 and a plurality of pins 316, 318, 320 and 322 extending from the upper surface 314. The plate 310 also has an upper surface 323 defining a number of openings 324, 326, 328 and 330 each operatively configured to receive and retain a corresponding one of the pins 316, 318, 320 and 322 so that the first aperture 312 is disposed over and accurately aligned with the window 206. Alternatively, the base ring 306 may be formed to incorporate the plate so that the base ring 306 has the first aperture 312.

The variable aperture assembly 300 also includes a single or first aperture blade 332 that is operatively coupled to the base ring 306 or the plate 310 so that the aperture blade 332 is adapted to move laterally relative to the first aperture 312. In the implementation shown in FIGS. 3A-3E, the aperture blade 332 has a first end 334, a second end 336, and an inner portion 338 disposed between the first and second ends where the inner portion 338 defines the second aperture 340. The aperture blade 332 is rotatably coupled at a pivot point (e.g., pin 320, which functions as a pivot pin) to either the base ring 306, the plate 310, or both. The second end 336 of the aperture blade 332 is adapted to be pivoted relative to the first end 334. In the implementation shown in FIGS. 3A-3E, the aperture blade 332 defines a pivot opening 341 that is adapted to receive and retain the pivot pin 320. In an alternate implementation, the pivot opening 341 may be defined by the base ring 306 or the plate 310 having the first aperture 312 while the pivot pin 320 is on a lower surface of the aperture blade 332. In either implementation, the pivot opening 341 and the pivot pin 320 engaged in the pivot opening 341 collectively define the pivot point for the aperture blade 332 relative to the first aperture 312.

As shown in FIGS. 3A-3E, the first end 334 and the second end 336 of the aperture blade 332 maybe extensions or projections of the inner portion 338. Alternatively, the first end 334 and the second end 336 may be opposing external sections of the inner portion 338, which may have a substantially circular, elliptical, square or other shape. The inner portion 338, however, has a size that is greater than the size of the first aperture 312 to enable the inner portion 338 to partially overlap the plate 310 when the aperture blade 332 is moved laterally over the first aperture 312 such that the second aperture 340 is axially aligned with the first aperture 312 and the underlying window 206 of the radiation detector housing 304 as shown in FIGS. 3B and 3E.

In one implementation, a first stop pin (e.g., pin 318) is disposed on the upper surface 314 or 323 of either the base ring 306 or the plate 310 away from the pivot point (e.g., pin 320). A second stop pin (e.g., pin 316) is disposed on the upper surface 314 or 323 across the first aperture 312 from the first stop pin 318 and substantially away from the pivot point or pin 320. As shown in FIGS. 3A-3E, the pivot pin 320, the first stop pin 318 and the second stop pin 316 are arranged in a triangular pattern about the first aperture 312. The first stop pin 318 is positioned relative to the pivot pin 320 so that the first stop pin 318 is adapted to engage the second end 336 of the aperture blade 332 to stop the lateral movement thereof when the aperture blade 332 is moved laterally away from the first aperture 312 and the first aperture 312 is exposed. The second stop pin 316 is positioned relative to the pivot pin 320 so that the second stop pin 316 is adapted to engage the second end 336 of the aperture blade 332 to stop the lateral movement thereof when the aperture blade 332 is moved laterally over the first aperture 312 so that the second aperture 340 is disposed over and in axial alignment with the window 206 of the radiation detector housing 304.

In one implementation, the plate 310 includes a lobed section 342 disposed relative to the first stop pin 318 and the pivot pin 320 so that the inner portion 338 of the aperture blade 332 rests on the lobed section 342 when the second end 336 of the aperture blade 332 engages the first stop pin 318 and the first aperture 312 is exposed. To further decrease the weight and mass of the variable aperture assembly 300, a central portion 344 of the lobed section 342 may be removed. In addition, the lobed section 342 allows sufficient thermal conductivity with the plate 312, base ring 306, and the radiation detector housing 304 so as to maintain the aperture blade 332 at a uniform operational temperature that otherwise might be elevated due to the incident thermal radiation thereon when the inner portion 338 of the blade 332 is or is not resting on the lobed section 342.

As shown in FIGS. 3A-3E, the variable aperture assembly 300 also includes an aperture drive mechanism 344 having a body 346 and an actuator coupling member 348 extending at an angle 350 from the body 346 such that the actuator assembly 302 (or actuator assembly 402, 402a, 502 or 902 described herein) may engage the actuator coupling member 348 and drive the aperture drive mechanism 344 while being disposed next to the radiation detector housing 304 and within the vacuum chamber 218 of the imaging system 200. In the implementation shown in FIGS. 3A and 3B, the actuator coupling member 348 includes a rod 352 extending down from and perpendicular to the body 346 of the aperture drive mechanism 344. In this implementation, the actuator assembly 302 includes an actuator arm 354 that has a recess 356 (e.g., defined by pins 358a and 358b) on one end 360 of the actuator arm 354. The recess 356 is adapted to engage and laterally retain the rod 352 so that the actuator arm 354 controls the lateral movement of the aperture drive mechanism 344. The actuator arm 354 may be comprised of titanium, plastic, or other poor thermal conducting material that is also low in friction to improve reliability.

FIG. 3F is a perspective view of an alternative aperture drive mechanism 362 for the variable aperture assembly 300 and a corresponding alternative actuator arm 364 for the aperture actuator assembly 302. The actuator arm 364 is consistent with the actuator arm 354 except that the actuator arm 364 includes a rod 365 instead of a recess 356. The rod 365 extends from the end 366 of the actuator arm 364 toward the aperture drive mechanism 362. The aperture drive mechanism 362 is consistent with the aperture drive mechanism 344 except that the actuator coupling member 367 of the aperture drive mechanism 362 has a flange 368 instead of a rod 352 extending down from and perpendicular to the body 346 of the aperture drive mechanism 362. The flange 368 has an opening 369 adapted to receive and laterally retain the rod 365 on the actuator arm 364 of the actuator assembly 302 shown in FIG. 3F so that the actuator arm 364 controls the lateral movement of the aperture drive mechanism 344.

As shown in FIGS. 3A-3F, the body 346 of the aperture drive mechanism 344 and 362 is operatively coupled to the base ring 306 and to each aperture blade 332 such that the aperture drive mechanism 344 or 362 drives each aperture blade 332 laterally away from the first aperture 312 in response to the actuator coupling member 348 or 367 being moved in a first lateral direction (e.g., direction reflected by arrow 370a in FIG. 3A), and laterally over the first aperture 312 to define or move the second aperture 340 over the window 206 in response to the actuator coupling member 348 or 367 being moved in a second lateral direction (e.g., direction reflected by arrow 370b in FIG. 3B).

In the implementation shown in FIGS. 3A-3F, the body 346 of the aperture drive mechanism 344 and 362 corresponds to a drive arm that includes a first end 372a and a second end 372b. The first end 372a is pivotally coupled near the pivot point (e.g., pin 320 and pivot opening 341) to the aperture blade 332. The first end 372a of the body 346 or drive arm has a drive pin 373 that is received and retained by a drive opening 374 (shown best in FIG. 3C) defined near the pivot opening 341 by the aperture blade 332. In an alternate implementation, the first end 372a of the body 346 or drive arm may define the drive opening 374 and the drive pin 373 may be disposed on the aperture blade 332 near the pivot point corresponding to the pivot opening 341.

The second end 372b of the body 346 or drive arm has a track 376 adapted to receive and control the lateral movement of a third stop pin (e.g., pin 322) disposed on the upper surface 316 or 323 of the base ring 306 or the plate 310 when engaged to the base ring 306. The track 376 of the drive arm defines a lateral travel range for the aperture drive mechanism 344. The track 376 has a first terminal 377a adapted to engage the third stop pin 322 when the actuator coupling member 348 is moved in the first lateral direction 370a so that the aperture blade 332 is rotated away from the first aperture 312 to a first position where the second end 336 of the aperture blade 332 is engaged by the first stop pin 318 as shown in FIGS. 3A and 3D. The track 376 also has a second terminal 377b adapted to engage the third stop pin 322 when the actuator coupling member 348 is moved in the second lateral direction 370b so that the aperture blade 332 is rotated over the first aperture 312 to a second position where the second end 336 of the aperture blade 332 is engaged by the second stop pin 316 as shown in FIGS. 3B, 3E and 3F.

As shown in FIGS. 3A, 3B and 3F, the actuator arm 354 and 364 each have a first end 378 operatively coupled to an actuator 380 of the actuator assembly 302 and a second end 360, which (as previously discussed) is adapted to engage the actuator coupling member 348 or 367 of the aperture drive mechanism 346 or 362 so that the actuator 380 controls the lateral movement of the actuator coupling member 348 or 367. In the implementation shown in FIGS. 3A and 313, the actuator 380 includes a piezoelectric motor 381 having an actuator rod 382. The actuator rod 382 is operatively coupled to the first end 378 of the actuator arm 354 or 364 and is adapted to be selectively moved between a first position (such as shown in FIG. 3A) to cause the actuator arm 354 or 364 to move in the first lateral direction 370a and a second position (such as shown in FIG. 3B) to enable the actuator arm 354 or 364 to move in the second lateral direction 370b.

The actuator assembly 302 may also include a mounting bracket 383 extending vertically relative to the radiation detector housing 304. The actuator arm 354 or 364 may be operatively coupled to the mounting bracket 383 such that the second end 360 of the actuator arm 354 or 364 is adapted to move in the first lateral direction 370a and the second lateral direction 370b. In one implementation, the actuator assembly 302 includes an L-shaped linkage member 384 operatively coupled between the first end 378 of the actuator arm 354 or 364 and the actuator rod 382 of the piezoelectric motor 381. The linkage member 384 has a first end 385, a second end 386, and a corner 387 that is pivotally attached to the mounting bracket 383 via a pin 398, a torsion spring or other pivoting means. The first end 385 is pivotally coupled (e.g., via a pin 388) to the first end 378 of the actuator arm 354 or 364. The linkage member 384 also has a flange 389 disposed at or near the second end 386 of the linkage member 384. The actuator rod 382 of the piezoelectric motor 381 is disposed relative to the flange 389 so that the actuator rod 382 is adapted to engage the flange 389 when moving from the first position to the second position such that the first end 385 of the linkage member 384 pivots about the corner 387 and drives the second end 360 or 366 of the actuator arm 354 or 364 in a corresponding one of the first lateral direction 370a or the second lateral direction 370b. For example, in the implementation shown in FIG. 3B, the actuator rod 382 of the piezoelectric motor 381 is adapted to engage and drive the flange 389 downward when moving from the first position to the second position causing the first end 385 of the linkage member 384 to pivot about the corner 387 and drive the second end 360 or 366 of the actuator arm 354 or 364 in the second lateral direction 370b.

As shown in FIGS. 3A and 3B, the actuator assembly 302 may also include a bias member 390 (such as a spring, torsion bar, elastic band or other bias member) operatively coupled between the vertical mounting bracket 383 and a point (e.g., a pin 391 affixed to the linkage member 384) near the second end 386 of the linkage member 384 to bias the flange 389 vertically when the actuator rod 382 of the piezoelectric motor 381 is moved towards the first position. Accordingly, when the actuator rod 382 of the piezoelectric motor 381 is moved towards the first position and away from the flange 389, the bias member 390 biases the first end 385 of the linkage member 384 to pivot about the corner 387 of the linkage member 384 so that the second end 360 of the actuator arm is driven in another of the first lateral direction 370a or the second lateral direction 370b. For example, in the implementation shown in FIG. 3A, when moving from the second position to the first position, the actuator rod 382 of the piezoelectric motor 381 moves away from the flange 389 and the bias member 390 biases the first end 385 of the linkage member so that the first end 385 of the linkage member 384 pivots about the corner 387 and drives the second end 360 of the actuator arm 354 or 364 in the first lateral direction 370a.

FIGS. 4A-4G depict a second embodiment of a variable aperture assembly 400 and FIGS.

4A, 4B and 4H depict a second embodiment of a corresponding aperture actuator assembly 402 suitable for implementing the present invention in the infrared imaging system 200 having a radiation detector housing 304. Again, components of the imaging system 200, such as the vacuum chamber 218, are not shown in FIGS. 4A-4H to avoid obscuring inventive aspects of the variable aperture assembly 400 and the aperture actuator assembly 402.

The variable aperture assembly 400 includes a base ring 404, a plate 426 having a fixed aperture 428, two aperture blades 438 and 440, and an aperture drive mechanism 410. The base ring 404 has a first opening 406 and is mounted on the radiation detector housing 304 such that the first opening 406 is in axial alignment with the window 206 of the housing 304. The base ring 404 may be mounted to the radiation detector housing 304 via epoxy, soldering, or other fastening technique. The base ring 404 and the plate 426 may each be comprised of a conductive metal or alloy that allows heat produced by the variable aperture assembly or received from radiation incident on the variable aperture assembly to be dissipated via the housing 304. The base ring 404 has an outer diameter 407 that defines an outer surface 408. The base ring 404 also has a flange 409 extending from the outer surface 408. In one implementation, the flange 409 is one of a plurality of flanges 409 circumferentially spaced about the base ring 404.

The aperture drive mechanism 410 has a body 411 and an actuator coupling member 412 extending at an angle 413 from the body 411 such that the actuator assembly 402 (or actuator assembly 302, 402a, or 502 described herein) may engage the actuator coupling member 412 and drive the aperture drive mechanism 410 while being disposed next to the radiation detector housing 304 and within the vacuum chamber 218 of the imaging system 200. In the implementation shown in FIGS. 4A-4G, the actuator coupling member 412 includes a rod 414 extending down from and perpendicular to the body 411 of the aperture drive mechanism 410. In this implementation, the actuator assembly 402 includes an actuator arm 416 having a recess 418 (e.g., defined by pins 419 and 420 in FIG. 4H) on one end 422 (i.e., the second end) of the actuator arm 416. The recess 418 is adapted to engage and laterally retain the rod 414 of the actuator coupling member 412 so that the actuator arm 416 controls the lateral movement of the aperture drive mechanism 410. As further discussed below, the actuator assembly 402 includes a rotary actuator 423 operatively coupled to another end 424 (i.e., the first end) of the actuator arm 416 and adapted to control the rotational movement of the actuator arm 416. The actuator arm 416 may be comprised of titanium, plastic, or other poor thermal conducting material that is also low in friction to improve reliability.

In an alternative implementation, instead of a recess 418, the actuator arm 416 may have a rod 365 on the one end 422 (consistent with the rod 365 on the actuator arm 354 in FIG. 3F), where the rod 365 extends toward the aperture drive mechanism 410. In this implementation, the actuator coupling member 412 of the aperture drive mechanism 410 may have a flange 368 having an opening 369 instead of a rod 414 consistent with the aperture drive mechanism 362 in FIG. 3F. As previously discussed, the flange opening 369 is adapted to receive and laterally retain the rod 365 on the actuator arm of the actuator assembly so that the actuator arm controls the lateral movement of the aperture drive mechanism 410.

In the implementation of the variable aperture assembly 400 shown in FIGS. 4A-4G, the body 411 of the aperture drive mechanism 410 corresponds to a drive ring adapted to rotate about the base ring 404 in sliding contact with the one or more flanges 409 extending from the outer surface 408 of the base ring 404. In this implementation, the drive ring 411 has an inner diameter 425 that is equal to or larger than the outer diameter 407 of the base ring 404.

The plate 426 having the first aperture 428 is engaged or attached to the base ring 404 such that the first aperture 428 is disposed over the window 206 of the housing 304. In the implementation shown in FIGS. 4A-4G, the base ring 404 has an upper surface 430 and a plurality of pins 432 and 433 extending from the upper surface 430. The plate 426 also has an upper surface 434 defining a number of openings 436 and 437 each operatively configured to receive and retain a corresponding one of the pins 432 and 433 so that the first aperture 428 is disposed over and accurately aligned with the window 206 of the housing 304. Alternatively, the base ring 404 may be formed to incorporate the plate 426 so that the base ring 404 has the first aperture 428.

Each of the two aperture blades 438 and 440 are operatively coupled to the base ring 404 or the plate 426 so that each aperture blade 438 and 440 is adapted to move laterally relative to the first aperture 428. In the implementation shown in FIGS. 4A-4G, each aperture blade 438 and 440 has a first end 442 or 443, a second end 444 or 445, and a front edge 446 and 447. The first end 442 or 443 of each blade 438 and 440 has a pivot opening 450 adapted to receive a respective one of a plurality of pivot pins (e.g., pins 432 and 433) circumferentially spaced on the upper surface 430 of the base ring 404. The first end 442 or 443 of each blade 438 and 440 also has a drive opening 452 adapted to receive a respective one of a plurality of drive pins 454 and 456 circumferentially spaced on the drive ring 411 relative to the pivot pins 432 and 433 on the base ring 404 such that the second end 444 or 445 of the respective blade 438 or 440 is adapted to pivot relative to the first end 442 or 443 when the drive ring 411 is rotated about the base ring 404. As further described herein, the front edge 446 or 447 of each aperture blade 438 and 440 collectively define a second aperture 448 that is disposed over the radiation detector housing's window 206 in response to the actuator coupling member 412 (or rod 414) being moved in a the second lateral direction 370b so that the drive ring 411 is rotated in the same direction about the base ring 404 as shown in FIGS. 4B, 4F and 4G.

In an alternative implementation, each pivot opening 450 may be defined by the base ring 404 or the plate 426 having the first aperture 428 while a respective pivot pin 432 or 433 is disposed on a lower surface of the first end 442 or 444 of a respective aperture blade 438 or 440. In either implementation, each pivot opening 450 and the pivot pin 432 or 433 engaged in the pivot opening 450 collectively define the pivot point for the respective aperture blade 438 or 440.

The drive ring 411 may also have a plurality of stop pins 458 and 459 circumferentially spaced on the drive ring 411 such that each drive pin 454 and 456 is disposed between a respective two of the stop pins 458 and 459. Each stop pin 458 and 459 is adapted to engage the second end 444 or 445 of a respective one of the aperture blades 438 or 440 to stop the lateral movement thereof when the aperture blade 438 or 440 is moved laterally away from the first aperture 428 so that the first aperture 428 is exposed as shown in FIGS. 4A, 4D and 4E.

Each pivot pin 432 and 433 (when received in the pivot opening 450 of the respective aperture blade 438 or 440) may also be adapted to engage the second end 444 or 445 of a respective second or adjacent one of the aperture blades 440 or 438 to stop the lateral movement thereof when the aperture blade 440 or 438 is moved laterally over the first aperture 428 so that the second aperture 448 is collectively defined by the front edges 446 and 447 of the blades and disposed over the window 206 of the radiation detector housing 304 as shown in FIGS. 4B, 4F and 4G.

As described herein, the drive ring 411 (i.e., the body of the aperture drive mechanism 410) is operatively coupled to the base ring 404 via sliding engagement with the flange 409 extending from the outer surface 408 of the base ring 404. The drive ring 411 is also operatively coupled to each aperture blade 438 and 440 via a respective drive pin 454 or 456. The aperture drive mechanism 410 is adapted to drive each aperture blade 438 and 440 about a respective pivot pin 432 and 433 so that each aperture blade 438 and 440 moves laterally away from the first aperture 428 in response to the actuator coupling member 412 (which extends from the drive ring 411) being moved in the first lateral direction (e.g., direction reflected by arrow 370a in FIG. 4A). In addition, the drive mechanism 410 is adapted to drive each aperture blade 438 and 440 in a reverse direction about a respective pivot pin 432 and 433 so that each aperture blade 438 and 440 moves laterally over the first aperture 428 to define the second aperture 448 over the window 206 in response to the actuator coupling member 412 being moved in the second lateral direction (e.g., direction reflected by arrow 370b in FIG. 4B).

As shown in FIGS. 4A, 4B and 4C, the variable aperture assembly 400 may also include a cover ring 460 having an inner aperture 462 that has a size equal to or greater than the size of the first aperture 428. The cover ring 460 is disposed over and vertically retains or captivates the aperture blades 438 and 440 to the base ring 404 and/or the drive ring 410. In one implementation, the cover ring 460 is attached to the pivot pins 432 and 433 so that the cover ring 460 is suspended above the aperture blades 438 and 440 so that each aperture blade 438 and 440 is adapted to freely rotate about a respective pivot pin 432 or 433 between a respective stop pin 458 or 459 and a respective drive pin 454 and 456.

Figure 4H:
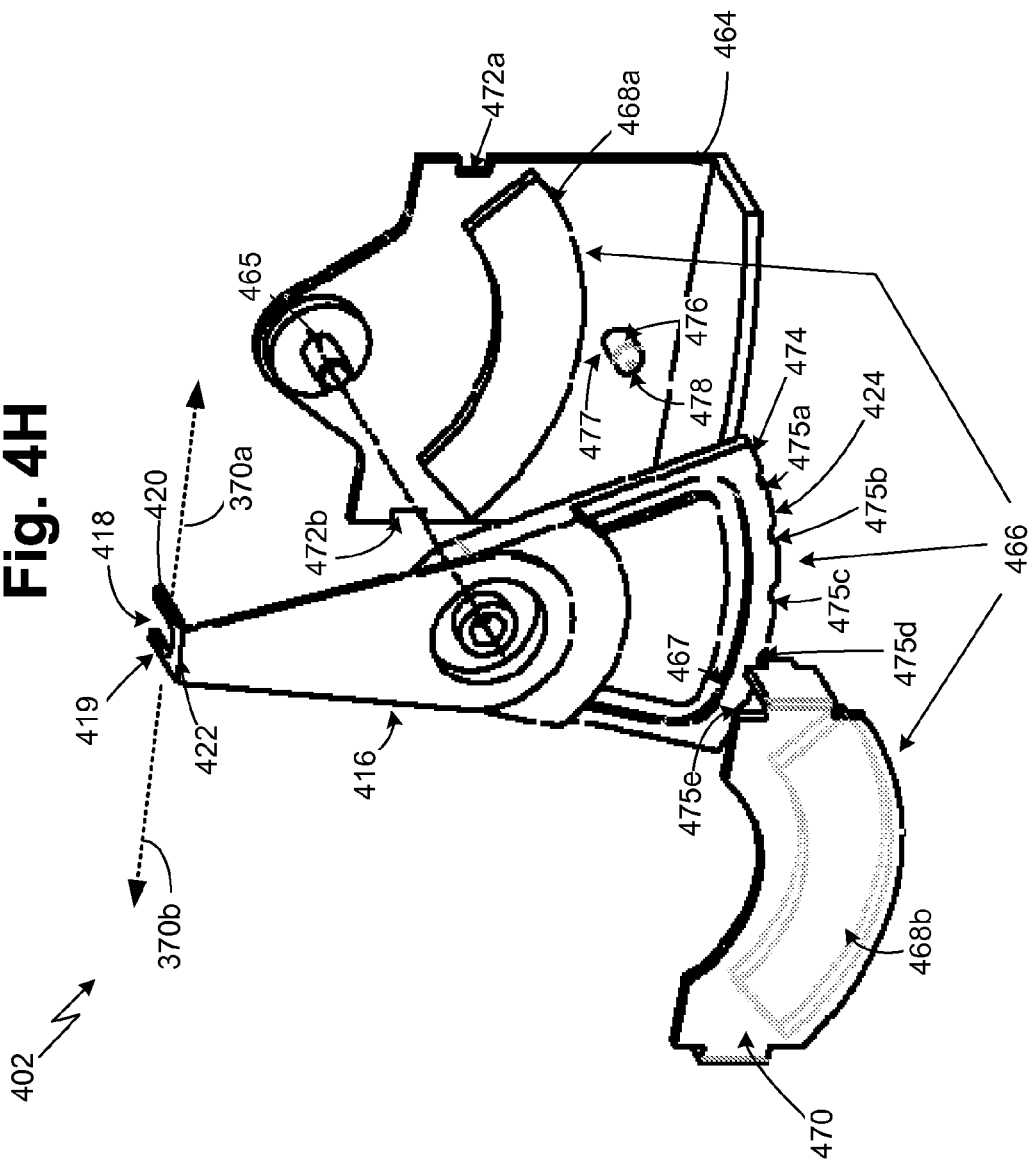
FIG. 4H is an exploded view of the aperture actuator assembly depicted in FIGS. 4A and B.

Turning again to the actuator assembly 402 shown in FIGS. 4A, 4B and 4H, the actuator assembly 402 includes a mounting bracket 464 extending vertically relative to the radiation detector housing 304. The actuator arm 416 is pivotally coupled to the mounting bracket (e.g., via a pin 465) such that the second end 422 of the actuator arm is adapted to rotate in the first lateral direction 370a and the second lateral direction 370b.

In the implementation shown in FIGS. 4A, 4B and 4H, the rotary actuator 423 is a voice coil actuator that includes a voice coil motor 466. The voice coil motor 466 comprises a wire coil 467 and one or more magnets 468a and 468b, each of which may be a permanent or non-permanent magnet. The wire coil 467 is incorporated in the actuator arm 416 near the first end 424. The wire coil 467 is operatively configured to receive a drive current via a drive current motor (not shown in the figures). Each magnet 468a-468b is disposed relative to the wire coil 467 so that the respective magnet 468a-468b drives the first end 424 of the actuator arm 416 away from the magnet 468a or 468b in a predetermined direction in response to the drive current flowing through the wire coil 467. The predetermined direction of the first end 424 of the actuator arm corresponds to either the first lateral direction 370a or the second lateral direction 370b (opposite to the lateral direction of movement of the second end 422 as shown in the figures) based on the direction of flow of the drive current through the wire coil 467.

In the implementation shown in FIGS. 4A, 4B, and 4H, the wire coil 467 is disposed between a pair of magnets 468a and 468b so that, when a drive current is flowing through the wire coil 467, the magnetic field produced by each of the magnets 468a and 468b drives or forces the first end 424 of the actuator arm 416 (which has the wire coil 467) about the pivot pin 465 in the predetermined direction corresponding to the direction of flow of the drive current. The second end 422 of the actuator arm 216 then drives the actuator coupling member 412 of the aperture drive mechanism 410 in a corresponding lateral direction (e.g., opposite to the lateral movement of the first end 424). The amount of lateral travel of each end 422 and 424 of the actuator arm 416 is controlled by the amplitude of the drive current received by and flowing through the wire coil 467.

A first of the pair of magnets 468a is affixed to the vertical mounting plate 464. A second of the pair of magnets 468b may be affixed to a cross bracket 470 that is attached to either or both sides 472a and 472b of the mounting bracket 464 such that the first end 424 of the actuator arm 416 may rotate freely about the pivot pin 465 and between the pair of magnets 468a and 468b without contacting or engaging the cross bracket 470. Each magnet 468a and 468b may have an arcuate shape and a respective length that enables the wire coil 467 to remain at least partially between the pair of magnets 468a and 468b as the first end 424 of the actuator arm 416 is rotated about the pivot pin 465.

In one implementation, the first end 424 of the actuator arm 416 has an arcuate outer surface 474 having a plurality of detents 475a-475e corresponding to a plurality of predetermined positions for the actuator arm 416. The actuator assembly 402 further comprises a spring pin 476 having a first end 477 attached to one of the brackets 464 or 470, or to one of the magnets 468a or 468b. The spring pin 476 has a second end 478 disposed relative to the first end 424 of the actuator arm 416 such that the spring pin 476 is adapted to removably engage one (e.g., 475b) of the plurality of detents 475a-475e to retain the actuator arm 416 in a corresponding one of the predetermined positions when the drive current is not flowing through the wire coil 467. When the drive current is flowing through the wire coil 467, the magnetic field produced by each magnet 468a and 468b (collectively or alone) may be sufficient to cause the actuator arm 416 to move and disengage the spring pin 476 from the one detent (e.g., 475b).

FIGS. 4I and 4J depict another implementation of an aperture actuator assembly 402a suitable for implementing the present invention in the infrared imaging system 200. The aperture actuator assembly 402a has components consistent with the actuator assembly 402 except that, in lieu of a spring pin 476 and detents 475a-475e on the second end 424 of the actuator arm 416, one of the actuator arm 416 and the mounting bracket 464 has a metal portion 482, and the other of the actuator arm 416 and the mounting bracket 464 has a restraining magnet 483 disposed relative to and having an attraction for the metal portion 482. In this implementation, the restraining magnet 483 has sufficient attraction to the metal portion 482 so that the restraining magnet 483 is adapted to retain the actuator arm 416 in its current rotated position when the drive current is not flowing through the wire coil. When the drive current is flowing through the wire coil 467, the magnetic field produced by each magnet 468a and 468b (collectively or alone) may be sufficient to cause the actuator arm 416 to move and disengage the attraction of the restraining magnet 464 to the metal portion 483.

Alternatively, as shown in FIGS. 4I and 4J, in lieu of or in addition to the detents 475a-475e, the actuator arm 416 may have a plurality of detent magnets 484a-484e corresponding to a plurality of predetermined positions for the actuator arm 416. Each detent magnet 484a-484e has a first polarity. The restraining magnet 483 has a second polarity. The restraining magnet 483 is disposed on the mounting bracket 464 relative to the plurality of detent magnets 484a-484e such that the restraining magnet 483 is attracted to a closest one of the detent magnets 484a-484e to retain the actuator arm 416 in a corresponding one of the predetermined positions when the drive current is not flowing through the wire coil 467. When the drive current is flowing through the wire coil 467, the magnetic field produced by each magnet 468a and 468b (collectively or alone) may be sufficient to cause the actuator arm 416 to move and disengage the attraction of the restraining magnet 464 to the detent magnets 484a-484e.

It is contemplated that the restraining magnet 483 may be disposed on the actuator arm 416 and the detent magnets 484a-484e may be disposed on the mounting bracket 464 relative to the restraining magnet 483 such that the restraining magnet 483 is attracted to a closest one of the detent magnets 484a-484e to retain the actuator arm 416 in a corresponding one of the predetermined positions when the drive current is not flowing through the wire coil.

Figure 5I:
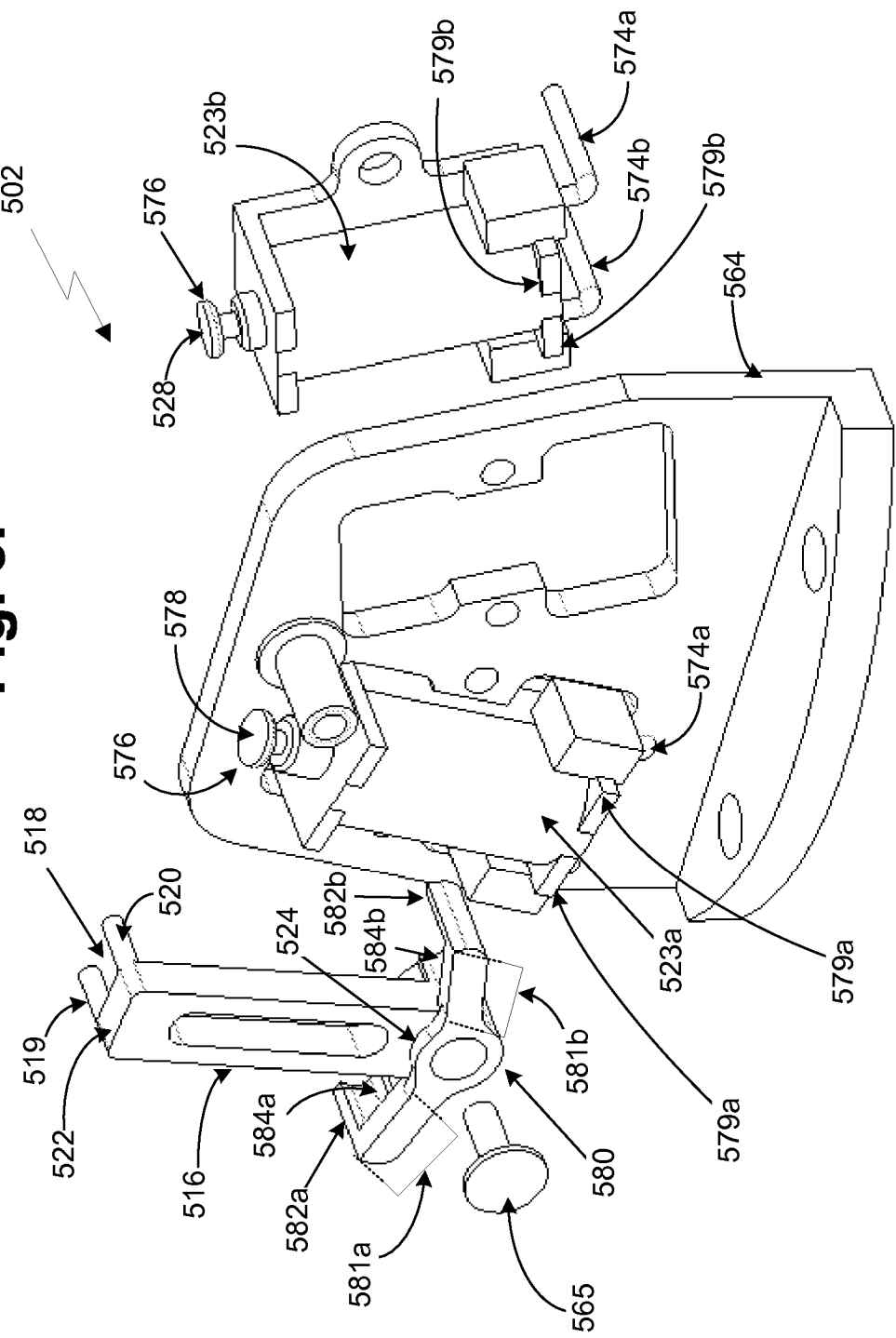
FIG. 5I is an exploded view of the actuator assembly depicted in FIGS. 5A and 5B.

FIGS. 5A-5H depict a third embodiment of a variable aperture assembly 500 and FIGS. 5A, 5B and 5I depict a fourth embodiment of a corresponding aperture actuator assembly 502 suitable for implementing the present invention in the infrared imaging system 200 having a radiation detector housing 304. The variable aperture assembly 500 includes a base ring 504, a plate 526 having a fixed aperture 528, four aperture blades 538a-538d and an aperture drive mechanism 510. The base ring 504 has a first opening 506 and mounted on the radiation detector housing 304 such that the first opening 506 is in axial alignment with the window 206 of the housing 304. The base ring 504 may be mounted to the radiation detector housing 304 via epoxy, soldering, or other fastening technique. As previously discussed, the base ring 504 and the plate 526 may each be comprised of a conductive metal or alloy that allows heat produced by the variable aperture assembly 500 or received from radiation incident on the variable aperture assembly 500 to be dissipated via the housing 304. The base ring 504 has an outer diameter 507 that defines an outer surface 508 and a flange 509 extending from the outer surface 508. The flange 509 may be one of a plurality of flanges 509 circumferentially spaced about the base ring 504.

The aperture drive mechanism 510 has a body 511 and an actuator coupling member 512 extending at an angle 513 from the body 511 such that the actuator assembly 502 (or actuator assembly 302, 402, or 402a described herein) may couple to the actuator coupling member 512 and drive the aperture drive mechanism 510 while being disposed next to the radiation detector housing 304 and within the vacuum chamber 218 of the imaging system 200. In the implementation shown in FIGS. 5A-5H, the actuator coupling member 512 includes a rod 514 extending down from and perpendicular to the body 511 of the aperture drive mechanism 510. In this implementation, the actuator assembly 502 includes an actuator arm 516 having a recess 518 (e.g., defined by pins 519 and 520 as best seen in FIG. 5I) on one end 522 (i.e., the second end) of the actuator arm 516. The recess 518 is adapted to engage and laterally retain the rod 514 of the actuator coupling member 512 so that the actuator arm 516 controls the lateral movement of the aperture drive mechanism 510. As further discussed below, the actuator assembly 502 includes an actuator 523 operatively coupled to another end 524 (i.e., the first end) of the actuator arm 516 and adapted to control the rotational movement of the actuator arm 516.

In an alternative implementation, instead of a recess 518, the actuator arm 516 may have a rod 365 on the one end 522 (consistent with the rod 365 on the actuator arm 916 in FIGS. 9A and 9B discussed herein), where the rod 365 extends toward the aperture drive mechanism 510. In this implementation, the actuator coupling member 512 of the aperture drive mechanism 510 may have a flange 368 having an opening 369 instead of a rod 514 consistent with the aperture drive mechanism 362 in FIG. 3F or the aperture drive mechanism 910 in FIGS. 9A and 9B. As previously discussed, the flange opening 369 is adapted to receive and laterally retain the rod 365 on the actuator arm of the actuator assembly so that the actuator arm controls the lateral movement of the aperture drive mechanism 510.

In the implementation of the variable aperture assembly 500 shown in FIGS. 5A-5G, the body 511 of the aperture drive mechanism 510 corresponds to a drive ring adapted to rotate about the base ring 504 in sliding contact with the one or more flanges 509 extending from the outer surface 508 of the base ring 504. To facilitate a sliding contact coupling between the drive ring 511 and the base ring 504, the drive ring 511 may have an inner diameter 525 that is equal to or larger than the outer diameter 507 of the base ring 504.

The plate 526 having the first aperture 528 is engaged or attached to the base ring 504 such that the first aperture 528 is disposed over the window 206 of the housing 304. In the implementation shown in FIGS. 5A-5G, the base ring 504 has an upper surface 530 and a plurality of pivot pins 532a-532d extending from the upper surface 530. The plate 526 also has an upper surface 534 defining a number of openings 536a-536d each operatively configured to receive and retain a corresponding one of the pivot pins 532a-532d so that the first aperture 528 is disposed over and accurately aligned with the window 206 of the housing 304. Alternatively, the base ring 504 may be formed to incorporate the plate 526 so that the base ring 504 has the first aperture 528.

Each of the aperture blades 538a-538d is operatively coupled to the base ring 504 or the plate 526 so that each aperture blade 538a-538d is adapted to move laterally relative to the first aperture 528. In the implementation shown in FIGS. 5A-5H, each aperture blade 538a-538d has a first end 542a-542d, a second end 544a-544d, and a front edge 546a-546d. The first end 542a-542d of each blade 538a-538d has a pivot opening 550 adapted to receive a respective one the pivot pins 532a-532d circumferentially spaced on the upper surface 530 of the base ring 504.

The drive ring 511 has a plurality of drive pins 554a-554d circumferentially spaced on the drive ring 511 relative to the pivot pins 532a-532d on the base ring 504. The first end 542a-542d of each blade 538a-538d has a drive opening 552 adapted to receive a respective one of the drive pins 554a-554d such that the second end 546a-5464 of the respective blade 538a-538d is adapted to pivot relative to the respective first end 542a-542d when the drive ring 511 is rotated about the base ring 504.

As further described herein, the front edge 546a-546d of each aperture blade 538a-538d collectively define a second aperture 548 disposed over the radiation detector housing's window 206 in response to the actuator coupling member 512 (or rod 514) being moved in a the second lateral direction 370b so that the drive ring 511 is rotated in the same direction about the base ring 504 as shown in FIGS. 5B, 5F and 5G.

In an alternate implementation, each pivot opening 550 may be defined by the base ring 504 or the plate 526 having the first aperture 528 while a respective pivot pin 532a-532d is disposed on a lower surface of the first end 542a-542d of a respective aperture blade 538a-538d. In either implementation, each pivot opening 550 and the pivot pin 532a-532d engaged in the pivot opening 550 collectively define the pivot point for the respective aperture blade 538a-538d.

In the implementation shown in FIGS. 5A-5H, each aperture blade 538a-538d has a respective top portion 559a-559d and a respective lower portion 560a-560d that collectively form a substantially L-shape having an external corner 561a-561d. FIG. 5H depicts an enlarged view of one of the aperture blades (e.g., 538d) of the variable aperture assembly 500 to illustrate the top portion (e.g., 559d) and the lower portion (e.g., 560d) that define or form the L-shape and corresponding external corner (e.g., 561d) of the respective aperture blade (e.g., 538d). The lower portion 560a-560d of each aperture blade 538a-538d includes the first end 542a-542d and has an outer edge 562a-562d. The top portion 559a-559d of each aperture blade 538a-538d includes the second end 544a-544d and has an external edge 563a-563d. The pivot opening 550 and the drive opening 552 of each aperture blade 538a-538d is disposed near the respective external corner 561a-561d.

The drive ring 511 may also have a plurality of stop pins 558a-558d circumferentially spaced on the drive ring 511 such that each drive pin 554a-554d is disposed between a respective two of the stop pins 558a-558d. Each stop pin 558a-558d is adapted to engage the external edge 563a-563d of the top portion 561a-561d of a respective one of the aperture blades 538a-538d to stop the lateral movement thereof when the aperture blade 538a-538d is moved laterally away from the first aperture 528 so that the first aperture 528 is exposed. Each stop pin 558a-558d is adapted to engage the outer edge 562a-562d of the lower portion 560a-560d of a respective second of the aperture blades 538a-538d to stop the lateral movement thereof when the aperture blade 538a-538d is moved laterally over the first aperture 528 so that the second aperture 548 (as defined by the front edge 546a-546d of each aperture blade 538a-538d) is disposed over the window 206. For example, in the implementation shown in FIGS. 5A-5H, the stop pin 558d is disposed on the drive ring 511 between the drive pin 554d for one aperture blade 538d and the drive pin 554c for a second aperture blade 538c. The stop pin 558d is adapted to engage the external edge 563d of the top portion 559d of the one aperture blade 538d to stop the lateral movement thereof when the aperture blade 538d is moved laterally away from the first aperture 528 to expose the first aperture 528 as shown in FIGS. 5D and 5E. The same stop pin 558d is adapted to engage the outer edge 562c of the lower portion 560c of the second aperture blade 538c to stop the lateral movement thereof when the aperture blade 538c is moved laterally over the first aperture 528 so that the second aperture 548 is disposed over the window 206 as shown in FIGS. 5F and 5G.

As described herein, the drive ring 511 (i.e., the body of the aperture drive mechanism 510) is operatively coupled to the base ring 504 via sliding engagement with the flange 509 extending from the outer surface 508 of the base ring 504. The drive ring 511 is also operatively coupled to each aperture blade 538a-538d via a respective drive pin 554a-554d. The aperture drive mechanism 510 is adapted to drive each aperture blade 538a-538d about a respective pivot pin 532a-532d so that each aperture blade 538a-538d moves laterally away from the first aperture 528 in response to the actuator coupling member 512 (which extends from the drive ring 511) being moved in the first lateral direction (e.g., direction reflected by arrow 370a in FIG. 5A). In addition, the drive mechanism 510 is adapted to drive each aperture blade 538a-538d in a reverse direction about a respective pivot pin 532a-532d so that each aperture blade 538a-538d moves laterally over the first aperture 528 to define the second aperture 548 over the window 206 in response to the actuator coupling member 512 being moved in the second lateral direction (e.g., direction reflected by arrow 370b in FIG. 5B).

As shown in FIGS. 5A, 5B and 5C, the variable aperture assembly 500 may also include a cover ring 570 having an inner aperture 572 that has a size that is equal to or greater than the size of the first aperture 528. The cover ring 570 is disposed over and vertically retains or captivates the aperture blades 538a-538d to the base ring 504 and/or the drive ring 510. In one implementation, the cover ring 570 is attached to the pivot pins 532a-532d so that the cover ring 570 is suspended above the aperture blades 538a-538d so that each aperture blade 538a-538d is adapted to freely rotate about a respective pivot pin 532a-532d between a respective pair of adjacent stop pins (e.g., pairs 558a & 558b; 558b & 558c, 558c & 558d, and 558d & 558a).

Turning again to the actuator assembly 502 shown in FIGS. 5A, 5B and 5H, the actuator assembly 502 includes a mounting bracket 564 extending vertically relative to the radiation detector housing 304. The actuator arm 516 is pivotally coupled to the mounting bracket (e.g., via a pin 565) such that the second end 522 of the actuator arm 516 is adapted to rotate in the first lateral direction 370a and the second lateral direction 370b. The actuator arm 516 may be comprised of titanium, plastic, or other poor thermal conducting material that is also low in friction to improve reliability.

In the implementation shown in FIGS. 5A, 5B and SI, the actuator 523 comprises one or more electromagnetic solenoids 523a and 523b. Each solenoid 523a and 523b has a drive input 574a, a return output 574b, and a piston 576. The drive input 574a and return output 574b of each solenoid 523a and 523b may be operatively coupled via the interconnect 254 to an external drive motor (not shown in figures) controlled by a backend processor (not shown in figures) both of which may be disposed external to the vacuum chamber 218 of the imaging system 200. The piston 576 of each solenoid 523a and 523b is adapted to move along a longitudinal axis 577a or 577b of the respective solenoid 523a or 523b between an extended position (as shown for solenoid 523a in FIG. 5A and for solenoid 523b in FIG. 5B) and a contracted position (as shown for solenoid 523b in FIG. 5A and for solenoid 523a in FIG. 5B) based on the respective drive input 574a. The drive input 574a of the first solenoid 523a is opposite in polarity to the drive input 574a of the second solenoid 523b (e.g., based on a respective drive signal that may be present on each drive input 574a as provided by the external drive motor) such that the piston 576 of the first solenoid 523a moves in opposition to the piston 576 of the second solenoid 523b. For example, the piston 576 of the first solenoid 523a has an end 578 operatively coupled to the first end 524 of the actuator arm 516 so that the first solenoid's piston 576 (based on the polarity of its drive input 574a) is adapted to drive the second end 522 of the actuator arm 516 in the first lateral direction 370a when moving towards the extended position as shown in FIG. 5A and in the second lateral direction 370b when moving towards the contracted position as shown in FIG. 5B. The piston 576 of the second solenoid 523b has an end 578 operatively coupled to the first end 524 of the actuator arm 516 so that the second solenoid's piston 576 (based on the polarity of its drive input 574a) is adapted to drive the second end 522 of the actuator arm 516 in the first lateral direction 370a when moving towards the contracted position as shown in FIG. 5A and in the second lateral direction 370b when moving towards the extended position as shown in FIG. 5B.

In one implementation, in which the piston 576 of each solenoid 523a and 523b includes a metal or metal alloy having a magnetic attraction, the actuator 523 may also include one or more latching magnets 579a and 579b disposed relative to each solenoid 523b. In this implementation, each latching magnet 579a and 579b is operatively configured to hold the piston 576 of a respective one or each solenoid 523a and 523b in the piston's current position (i.e., a first position for the first solenoid 523a and a second position for the second solenoid 523b) when the electrical bias present on the drive input 574a or 574b of the respective solenoid 523a or 523b is removed. The current position for the respective piston 576 of each solenoid 523a is between the extended position and the contracted position of the respective piston 576. In an alternative implementation, the current position may be one of the contracted position or the extended position of the respective piston 576. Thus, the aperture 528 or 548 may be maintained as each piston 576 is held in its current position without having an electrical bias or power applied to each solenoid 523a and 523b, inhibiting potential thermal radiation from being generated by the actuator 523 during an image capture interval of the imaging system 200 (e.g., the interval when radiation is being collected by the radiation detector 206 for image processing).

In the implementation shown in FIGS. 5A, 5B, and SI, the actuator arm 516 has a transverse member 580 disposed near the first end 524 of the actuator arm 516 and defining (relative to the actuator arm 516) a first moment arm 581 a having a first distal end 582a and a second moment arm 581b having a second distal end 582b. The end 578 of each piston 576 is operatively coupled to or near the distal end 582a or 582b of either the first moment arm 581 a or the second moment arm 581b. In one implementation, the distal end 582a and 582b of each moment arm 581a and 581b has a recess 584a or 584b as shown in FIG. 5I adapted to engage and retain the end 578 of a respective piston 578. In this implementation, the actuator arm 516 having the transverse member 580 functions as a rocker arm actuated by the respective pistons 576 of each solenoid 523a and 523b to move the end 522 of the rocker arm 516 in the first lateral direction 370a or the second lateral direction 370b, causing the actuator coupling member 512 (or 348 in FIG. 3A, 367 in FIG. 3F, 412 in FIG. 4A, 712 in FIG. 7A or 962 in FIG. 9A) to move in the same direction to laterally drive the aperture drive mechanism 510 (or 344, 410, 710 or 910) of the respective variable aperture assembly 500 (or 300, 400, 600, 700, 800 or 900).

FIG. 6 depicts another implementation of a variable aperture assembly 600 suitable for implementing the present invention in the infrared imaging system 200 having a radiation detector housing 602. The variable aperture assembly 600 has components (including a base ring 604, a drive ring 510, aperture blades 538a-538d, and cover plate 570) that are consistent with and function the same as the same components in the variable aperture assembly 500 except the plate 526 of the variable aperture assembly 500 is incorporated into the base ring 604 of the variable aperture assembly 600 so that the base ring 604 has the first aperture 528. The base ring 604 is affixed to or incorporated into the radiation detector housing 602 such that the housing window (e.g., window 206 in FIG. 5C) corresponds to the first aperture 528. In one implementation, the base ring 604 is formed into a cover of the housing 602, via etching, a molding process, or other technique. In this implementation, the one or more flanges 509 extending from the outer surface 508 of the base ring 504 may be replaced by a lip 606 formed about the circumference of the base ring 604.

FIGS. 7A-7F depict a fifth embodiment of a variable aperture assembly 700 suitable for implementing the present invention. The variable aperture assembly 700 has a plurality of aperture blades operatively configured to be selectively adjusted via an aperture actuator assembly consistent with the present invention so as to vary an aperture defined by the aperture blades between a first size shown in FIG. 7A and a second size shown in FIG. 7B. The variable aperture assembly 700 is depicted as operatively coupled to and actuated by the aperture actuator assembly 302 as illustrated in FIGS. 7A and 7B. However, the aperture actuator assembly 302 may alternatively be operatively coupled to and actuated by the aperture actuator assembly 402, 402a, 502 or another aperture actuator assembly consistent with the present invention.

The variable aperture assembly 700 includes a base ring 704, a plate 726 having a fixed aperture 728, four aperture blades 738a-738d and an aperture drive mechanism 710. Although the structure and operation of the variable aperture assembly 700 is described as having four aperture blades 738a-738d, the variable aperture assembly 700 may be implemented using one blade (e.g., 738a) or two or more aperture blades (e.g., 738a and 738c) without departing from the present invention.

As shown in FIGS. 7A-7F, the plate 726 is engaged or attached to the base ring 704 such that the first aperture 728 is disposed over the inner or first opening 706 of the base ring 704 and over the window 206 of the housing 304. The first opening 706 of the base ring 704 is obscured from view in FIG. 7C by the plate 726 but may be defined to correspond to or have a larger size than the first aperture 728 of the plate 726. The base ring 704 is mounted on the radiation detector housing 304 such that the first opening 706 of the base ring 704 and the first aperture 728 of the plate 726 are each disposed over and in axial alignment with the window 206 of the housing 304. As previously discussed, the base ring 704 and the plate 726 may each be comprised of a conductive metal or alloy that allows heat produced by the variable aperture assembly 700 or received from radiation incident on the variable aperture assembly 700 to be dissipated via the housing 304. The plate 726 has a circular outer edge 729 that defines a rim 707 along an outer perimeter 709 of the base ring 704.

The aperture drive mechanism 710 has a body 711 and an actuator coupling member 712 extending at an angle 713 from the body 711 such that the actuator assembly 302, 402, 402a, or 502 may couple to the actuator coupling member 712 and drive the aperture drive mechanism 710 while being disposed next to the radiation detector housing 304 and within the vacuum chamber 218 of the imaging system 200. In the implementation shown in FIGS. 7A-7F, the actuator coupling member 712 includes a rod 714 extending down from and perpendicular to the body 711 of the aperture drive mechanism 710. In an alternative implementation, the actuator coupling member 712 of the aperture drive mechanism 710 may have a flange 368 having an opening 369 instead of a rod 714 consistent with the aperture drive mechanism 362 in FIG. 3F and the aperture drive mechanism 910 in FIGS. 9A-9C. In either implementation, the second end 360, 422, or 522 of the actuator arm 354, 416, or 516 may be adapted to engage and laterally retain the rod 714 or the flange 368 of the actuator coupling member 712 so that the actuator arm 354, 416, or 516 controls the lateral movement of the aperture drive mechanism 710 as described herein.

In the implementation of the variable aperture assembly 700 shown in FIGS. 7A-7F, the body 711 of the aperture drive mechanism 710 corresponds to a drive ring adapted to rotate about the outer edge 729 of the plate 726 in sliding contact with the rim 707 of the base ring 704. To facilitate a sliding contact coupling between the drive ring 711 and the base ring 704, the drive ring 711 may have an inner diameter 725 that is equal to or larger than the outer diameter 713 of the plate 704.

The plate 726 has an upper surface 730 and a first plurality of guide pins 732a-732d circumferentially spaced on the upper surface 730 of the plate 726. The drive ring 711 has a plurality of drive pins 754a-754d circumferentially spaced on the drive ring relative to the guide pins 732a-732d on the plate 726. In the implementation depicted in FIGS. 7A-7F, the drive ring 711 has circumferentially spaced lobes 755a-755d that extend from an outer edge 756 of the drive ring 711. In this implementation, each drive pin 754a-754d is disposed on a respective lobe 755a-755d of the drive ring 711.

Each of the aperture blades 738a-738d is operatively coupled to the base ring 704 or the plate 726 so that each aperture blade 738a-738d is adapted to move laterally relative to the first aperture 728. In the implementation shown in FIGS. 7A-7F, each aperture blade 738a-738d has a first end 742a-742d, a second end 744a-744d, and a front edge 746a-746d. Each aperture blade 738a-738d also has a first guide pin track 750a-750d running in a direction substantially parallel to a corresponding radial axis 260a-260d of the window 206 of the radiation detector housing 208 or 304 as shown, for example, in FIG. 7C. In addition, each aperture blade 738a-738d has a drive pin track 752a-752d running in a direction substantially diagonal to the first guide pin track 750a-750d of the respective aperture blade 738a-738d. Each of the drive pins 754a-754d is operatively coupled to the drive pin track 752a-752d of a corresponding one of the aperture blades 738a-738d such that each drive pin 754a-754d travels along the drive pin track 752a-752d of the corresponding aperture blade 738a-738d in response to the drive ring 711 being rotated about the outer edge 729 of the plate 726.

Each of the first guide pins 732a-732d is operatively coupled to the first guide pin track 750a-750d of a corresponding one of the aperture blades 738a-738d such that each first guide pin 732a-732d travels along the first guide pin track 750a-750d of the corresponding aperture blade 738a-738d in response to the drive pin 754a-754d traveling along the drive pin track 752a-752d of the corresponding aperture blade 738a-738d. Each aperture blade 738a-738d is adapted to move laterally away from the first aperture 728 along the radial axis 260a, 260b, 260c, or 260d of the window 206 corresponding to the first guide pin track 750a, 750b, 750c, or 750d of the aperture blade 738a-738d in response to the drive ring 711 being rotated about the plate 726 and the base ring 704 in the first lateral direction 757a as shown in FIG. 7A. In addition, each aperture blade 738a-738d is adapted to move laterally over the first aperture 728 along the radial axis 260a, 260b, 260c, or 260d of the window 206 corresponding to the first guide pin track 750a, 750b, 750c, or 750d of the aperture blade 738a-738d in response to the drive ring 711 being rotated about the plate 726 and the base ring 704 in the second lateral direction 757b.

In one implementation, to ensure each aperture blade 738a-738d does not rotate substantially when traveling along the radial axis 260a-260d of the window 206 corresponding to the first guide pin track 750a; 750d of the respective aperture blade 738a-738d, each aperture blade 738a-738d may include a second guide pin track 758a-758d running in a direction substantially parallel to the first guide pin track 750a-750d of the respective aperture blade 738a-738d. In this implementation, the plate 726 has a second plurality of guide pins 760a-760d circumferentially spaced on the plate 726. Each of the second guide pins 760a-760d is operatively coupled to the second guide pin track 758a-758d of a corresponding one of the aperture blades 738a-738d such that each second guide pin 760a-760d travels along the second guide pin track 738a-738d of the corresponding aperture blade 738a-738d in response to the drive pin 754a-754d traveling along the drive pin track 752a-752d of the corresponding aperture blade 738a-738d.

The front edge 746a-746d of each aperture blade 738a-738d collectively define a second aperture 748 disposed over the radiation detector housing's window 206 in response to the actuator coupling member 712 being moved in a the second lateral direction 757b so that the drive ring 711 is rotated in the same direction about the plate 726 and base ring 704 as shown in FIGS. 7B. In one implementation, the front edge (e.g., 746a) of each aperture blade (e.g., 738a) overlays and aligns with the front edge (e.g., 746b and/or 746d) of an adjacent aperture blade (e.g., 738b and/or 738d) such that a portion of the front edge 746a-746d of each aperture blade 738a-738d defines the second aperture 748. As illustrated in FIGS. 7D-7F, the portion of the front edge 746a-746d of each aperture blade 738a-738d that defines the second aperture 748 decreases as each aperture blade 738a-738d is moved over the first aperture 728 along the radial axis 260a, 260b, 260c, or 260d of the window 206 corresponding to the first guide pin track 750a, 750b, 750c, or 750d of the respective aperture blade 738a-738d.

In one implementation of the variable aperture assembly 700 as illustrated in FIGS. 7A-7F, the drive pin track 752a-752d of each aperture blade 738a-738d defines a lateral travel range for the respective aperture blade 738a-738d. In this implementation, each drive pin track 752a-752d has a first terminal 780a adapted to engage and stop the travel of a respective drive pin 754a-754d when the actuator coupling member 714 is moved in the first lateral direction 757a so that the respective aperture blade 752a-752d is driven laterally away from the first aperture 728 to a first position as shown in FIGS. 7A and 7D. Each drive pin track 752a-752d also has a second terminal 780b adapted to engage and stop the travel of the respective drive pin 754a-754d when the actuator coupling member 714 is moved in the second lateral direction 757b so that the respective aperture blade 752a-752d is driven laterally towards and over the first aperture to a second position as shown in FIGS. 7B and 7F. In an alternative implementation, instead of the drive pin track, the first guide pin track 750a-750d of each aperture blade 738a-738d may have respective terminal ends that define the lateral travel range for the respective aperture blade 738a-738d.

In the implementation depicted in FIGS. 7A-7F, the drive pin track 752a-752d of each aperture blade 738a-738d has a linear shape so that the respective blade 738a-738d may be incrementally driven in a linear manner by a corresponding drive pin 754a-754d, enabling the second aperture 748 to be incrementally varied in size in accordance with the travel of each drive pin 754a-754d between the first and second terminals 780a and 780b of the respective drive pin track 752a-752d. For example, FIG. 7E depicts the variable aperture assembly 700 in a state where the aperture blades 738a-738d have been adjusted via each drive pin 754a-754d traveling in the drive pin track 752-752 of a respective blade 738a-738b (where each drive pin 754a-754d may be actuated by the aperture actuator assembly 302, 402, 402a, or 502 as described herein) between the first and second terminals 780a and 780b of the respective drive pin track 752a-752d so that the aperture 748 defined by the aperture blades 738a-738b has a corresponding size that is smaller than the first size (e.g., the size of the first aperture) shown in FIG. 7A and larger than the second size shown in FIG. 7B.

In an alternative implementation, the drive pin track 752a-752d of each aperture blade 738a-738d may have a non-linear shape. For example, in the implementation depicted in FIGS. 8A and 813, an variable aperture assembly 800 is shown that has aperture blades 838a-838b consistent with the aperture blades 738a-738d of the variable aperture assembly 700, except each aperture blade 838a-838b of the variable aperture assembly 800 has an "S" shaped track 852a-852d that is a non-linear track for controlling the movement of the respective aperture blade 838a-838b and the size of the aperture 748 collectively defined by each of the front edges 746a-746d of the aperture blades 838a-838b as discussed herein. In this implementation, the S-shape of each track 852a-852d enables greater sensitivity in varying between larger sizes of the aperture 748 as each drive pin 754a-754d travels near the first terminal 780a of the respective S-shaped drive track 852a-852d and between smaller sizes of the aperture 748 as each drive pin 754a-754d travels near the second terminal 780b of the respective S-shaped drive track 852a-852d. This implementation may be desirable for a radiation detector housing 304 that may be employed in a family of imaging systems 200 in which each system requires switching between a narrow and a wide field of view optical system having range stops between, for example f/6 and f/3.

As shown in FIGS. 7A, 7B and 7C, the variable aperture assembly 700 may also include a cover ring 770 having an inner aperture 772 that has a size that is equal to or greater than the size of the first aperture 728 of the plate 726. The cover ring 770 is disposed over and vertically retains or captivates the aperture blades 738a-738d to the base ring 704 and/or the drive ring 711. In one implementation, the cover ring 770 is attached to one or more of the guide pins 732a-732d so that the cover ring 770 is suspended above the aperture blades 738a-38d so that each aperture blade 738a-738d is adapted to move relative to the guide pin tracks 750a-750d and 758a-758d of the respective aperture blade 738a-738d.

FIGS. 9A-9C depict a seventh embodiment of a variable aperture assembly 900 and a fifth embodiment of a corresponding aperture actuator assembly 902 suitable for implementing the present invention in the infrared imaging system 200 having a radiation detector housing 304. The components of the aperture actuator assembly 902 correspond to and function the same as the aperture actuator assembly 502 as described herein, except the actuator assembly 902 employs an actuator arm 966 having a rod 365 instead of an actuator arm 516 having a recess 518 as further discussed below.

The variable aperture assembly 900 includes a base ring 904, a plate 926 having a fixed aperture 928, a plurality of aperture blades 938a-938b, and an aperture drive mechanism 910. The base ring 904 has a first opening 906 and mounted on the radiation detector housing 304 such that the first opening 906 is in axial alignment with the window 206 of the housing 304. The base ring 904 may be mounted to the radiation detector housing 304 via epoxy, soldering, or other fastening technique. As previously discussed, the base ring 904 and the plate 926 may each be comprised of a conductive metal or alloy that allows heat produced by the variable aperture assembly or received from radiation incident on the variable aperture assembly to be dissipated via the housing 304.

In the implementation shown in FIGS. 9A-9C, the base ring 904 has an upper surface 907 defining a plurality of stop pin openings 908a and 908b each operatively configured to receive and retain a corresponding stop pin 909a and 909b. Each stop pin opening 908a-908b and corresponding stop pin 909a-909b (when received in the respective stop pin opening) are disposed on the upper surface 907 of the base ring 904 so that each stop pin 909a-909b is adapted to engage and stop the lateral movement (relative to the first aperture 928) of one of the aperture blades 938a-938b when the blade 938a-938b is moved away from the first aperture 928 as shown in FIG. 9A and is adapted to engage and stop the lateral movement of another of the aperture blades 938a-938b when the blade 938a-938b is moved towards or over the first aperture 928 as shown in FIG. 9B.

The upper surface 907 of the base ring 904 also defines a plurality of pivot pin openings 912a, 912b and 914 each operatively configured to receive and retain a corresponding pivot pin 916a, 916b or 918. As further described below, each pivot pin 916a, 916b, and 918 is operatively configured to engage either one of the aperture blades 938a-938b or the aperture drive mechanism 910 to allow the respective component to rotate relative to the base ring 904.

The plate 926 also has an upper surface 930 defining a number of openings 932a-932b and 934 each operatively configured to receive and retain a corresponding one of the pivot pins 916a, 916b and 918 so that the fast aperture 928 is disposed over and aligned with the base ring 904 and the window 206. The plate 926 may be interchanged with other plates 926 that have a different sized aperture 928 to enable the fixed aperture 928 to be varied depending on the optics system (not shown in the figures) and the corresponding field of view of the imaging system 200. Alternatively, the base ring 904 may be formed to incorporate the plate 926 so that the base ring 904 has the first, fixed aperture 928.

Each of the aperture blades 938a-938b are operatively coupled to the base ring 904 or the plate 926 at a pivot point so that each aperture blade 938a-938b is adapted to move laterally relative to the first aperture 928 and the vertical axis 224 of the radiation detector housing 304. In the implementation shown in FIGS. 9A-9C, each aperture blade 938a-938b has a first end 942a or 942b, a second end 944a or 944b, and a front edge 946a or 946b. The first end 942a-942b of each blade 938a-938b has a pivot opening 950 (e.g., the pivot point) adapted to receive a corresponding one of the pivot pins 916a and 916b to operatively couple the respective blade 938a-938b to the base ring 904 and/or the plate 926 so that the second end 944a or 944b of the aperture blade 938a or 938b is adapted to be pivoted relative to the first end 942a or 942b enabling the aperture blade 938a-938b to move laterally relative to the first aperture 928.

The first end 942a-942b of each of the aperture blades 938a-938b is also operatively coupled to a respective one of two ends 956a and 956b of the aperture drive mechanism 910 so that the aperture drive mechanism 910 controls the lateral movement of each blade 938a-938b relative to the first aperture 928. In the implementation shown in FIGS. 9A-9C, the first end 942a-942b of each blade 938a-938b also has a drive opening 952 and each end 956a-956b of the aperture drive mechanism 910 has a corresponding drive opening 953. In this implementation, the first end 942a or 942b of each of the aperture blades 938a and 938b is operatively coupled to a respective one of two ends 956a or 956b of the aperture drive mechanism 910 via a respective drive pin 954a or 954b. Each drive pin 954a and 954b is inserted into and retained by the drive opening 952 of the respective aperture blade 938a and the corresponding drive opening 953 at either end 956a or 956b of the aperture drive mechanism 910.

As further described herein, the front edge 946a or 946b of each aperture blade 938a-938b collectively define a second aperture 948 disposed over the radiation detector housing's window 206 in response to the aperture drive mechanism 910 (and the drive pins 954a and 954b) being moved in a second lateral direction 957b so that each aperture blade 938a-938b is moved towards or over the first aperture 928 as shown in FIG. 9B.

The aperture drive mechanism 910 has a body 960 and an actuator coupling member 962 extending at an angle 963 from the body 960 such that the actuator assembly 902 (or actuator assembly 302, 402, 402a, or 502 described herein) may couple to the actuator coupling member 962 and drive the aperture drive mechanism 910 while being disposed next to the radiation detector housing 304 and within the vacuum chamber 218 of the imaging system 200. In the implementation shown in FIGS. 9A-9C, the actuator coupling member 962 includes a flange 368 having an opening 369 extending down from and perpendicular to the body 960 of the aperture drive mechanism 910. In this implementation, the actuator assembly 902 includes an actuator arm 966 having a rod 365 on one end 970 (i.e., the second end) of the actuator arm 966. The flange opening 369 is adapted to engage and laterally retain the rod 365 of the actuator arm 966 so that the actuator arm 966 controls the lateral movement of the aperture drive mechanism 910.

In an alternative implementation, instead of the actuator assembly 902, the actuator assembly 502 may be employed to actuate the variable aperture assembly 900. In this implementation, the actuator coupling member 962 of the aperture drive mechanism 960 may have a rod 514 (instead of a flange 368) consistent with the aperture drive mechanism 510 in FIGS. 5A and 5B. As previously discussed, the recess 518 of the actuator arm 516 is adapted to receive and laterally retain the rod 514 on the aperture drive mechanism so that the actuator arm controls the lateral movement of the aperture drive mechanism 910.

In one implementation, the body 960 of the aperture drive mechanism 910 defines an inner opening 972 that is larger in size than the first aperture 928 of the plate 926 and the second aperture 948 defined by the aperture blades 938a-938b. The aperture drive mechanism 910 is disposed over the aperture blades so that the inner opening 972 encompasses the first aperture 928. The pivot pin 918 pivotally couples the body 960 of the aperture drive mechanism 910 to the base ring 904 and/or the plate 926 at a pivot point (e.g., at a pivot opening 974 on the body 960) between the ends 956a and 956b of the aperture drive mechanism so that the actuator coupling member 962 is adapted to be moved in the first lateral direction 957a as shown in FIG. 9A or the second lateral direction as shown in FIG. 9B. In this implementation, the ends 956a and 956b are arms extending laterally from the body 960 and the actuator coupling member 962 is disposed between the ends 956a and 956b across the inner opening 972 from the pivot point 974 of the aperture drive mechanism 910.

When attached to the base ring 904 and/or the plate 926, the aperture drive mechanism 910 may vertically retain or captivate the aperture blades 938a-938b to the base ring 904 and/or the plate 926 so that each aperture blade 938a-938b is adapted to laterally rotate about a respective pivot pin 916a or 916b between stop pins 909a and 909b. As described herein, the aperture drive mechanism 910 is adapted to drive each aperture blade 938a-938b about a respective pivot pin 916a or 916b so that each aperture blade 938a-938b moves laterally away from the first aperture 928 in response to the actuator coupling member 962 (which extends from the aperture drive mechanism body 960) being moved in the first lateral direction 957a shown in FIG. 9A. In addition, the drive mechanism 910 is adapted to drive each aperture blade 938a-938b in a reverse direction about a respective pivot pin 916a or 916b so that each aperture blade 938a-938b moves laterally over the first aperture 928 to define the second aperture 948 over the window 206 in response to the actuator coupling member 962 being moved in the second lateral direction 957b as shown in FIG. 9B.

In the implementation shown in FIGS. 9A-9C, each stop pin 909a and 909b (e.g., when received in a respective stop pin opening 908a or 908b) is disposed on the upper surface 907 of the base ring 904 between the pivot pins 916a and 916b coupling adjacent aperture blades 938a-938b to the base ring 904 and/or the plate 926. Each stop pin 909a and 909b is positioned relative to a respective pivot pin 916a or 916b so that each stop pin 909a and 909b is adapted to engage an external edge 976a or 976b of one of the aperture blades 938a or 938b to stop the lateral movement thereof when the aperture blade 938a is moved laterally away from the first aperture 928 and the first aperture 928 is exposed as illustrated in FIG. 9A. Each stop pin 909a and 909b is also adapted to engage the second end 944a or 944b of another of the aperture blades 938b or 938a to stop the lateral movement thereof when the other aperture blade 938b or 938a is moved laterally over the first aperture 928 so that the second aperture 948 is disposed over and in axial alignment with the window 206 of the radiation detector housing 304 as illustrated in FIG. 9B.

While various embodiments of the present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. An aperture actuator assembly for use in actuating a variable aperture assembly disposed over a window of a radiation detector housing in an imaging device, the variable aperture assembly including an aperture drive mechanism having a body and an actuator coupling member extending at an angle away from a plane of the body and adapted to be moved in a first lateral direction so that the variable aperture assembly defines a first aperture over the window and in a second lateral direction so that the variable aperture assembly defines a second aperture over the window, the aperture actuator assembly comprising:
    an actuator adapted to be disposed adjacent to the radiation detector housing below the actuator coupling member; and
    an actuator arm coupled to the actuator and the actuator coupling member so that the actuator controls the lateral movement of the actuator coupling member.

2. The aperture actuator assembly of claim 1 wherein the actuator arm has a first end operatively coupled to the actuator and a second end adapted to engage the actuator coupling member of the aperture drive mechanism.

3. The aperture actuator assembly of claim 2 wherein the actuator is a piezoelectric motor having an actuator rod operatively coupled to the first end of the actuator arm and adapted to be selectively moved between a first position to cause the actuator arm to move in the first lateral direction and a second position to enable the actuator arm to move in the second lateral direction.

4. The aperture actuator assembly of claim 3 further comprising:
    a mounting bracket extending vertically relative to the radiation detector housing, the actuator arm being operatively coupled to the mounting bracket such that the second end of the actuator arm is adapted to move in the first lateral direction and the second lateral direction; and
    an L-shaped linkage member operatively coupled between the first end of the actuator arm and the actuator rod of the piezoelectric motor, the linkage member having a first end pivotally coupled to the first end of the actuator arm, a second end having a flange, and a corner pivotally attached to the mounting bracket,
    wherein the actuator rod of the piezoelectric motor is adapted to engage the flange of the linkage member when moving from the first position to the second position such that the first end of the linkage member pivots about the corner of the linkage member and drives the second end of the actuator arm in one of the first lateral direction or the second lateral direction.

5. The aperture actuator assembly of claim 4 further comprising a bias member operatively coupled between the vertical bracket and a point near the second end of the linkage member to bias the flange of the linkage member vertically when the actuator rod of the piezoelectric motor is moved towards the first position such that the first end of the linkage member pivots about the corner of the linkage member and drives the second end of the actuator arm in another of the first lateral direction or the second lateral direction.

6. The aperture actuator assembly of claim 2 further comprising a mounting bracket extending vertically relative to the radiation detector housing,
    wherein the actuator arm is pivotally coupled to the mounting bracket such that the second end of the actuator arm is adapted to rotate in the first lateral direction and the second lateral direction, and
    wherein the actuator comprises a voice coil motor having a wire coil operatively configured to receive a drive current and a magnet, the wire coil being incorporated in the first end of the actuator arm and the magnet being disposed relative to the wire coil so that the magnet drives the first end of the actuator arm away from the magnet in a predetermined direction in response to the drive current flowing through the wire coil, the predetermined direction corresponding to one of the first lateral direction and the second lateral direction based on a direction of flow of the drive current through the wire coil.

7. The aperture actuator assembly of claim 6 wherein:
    the first end of the actuator arm has an arcuate outer surface having a plurality of detents corresponding to a plurality of predetermined positions for the actuator arm; and
    the actuator assembly further comprises a spring pin having a first end attached to one of the bracket or the magnet and a second end disposed relative to the first end of the actuator arm such that the spring pin is adapted to removably engage one of the plurality of detents to retain the actuator arm in a corresponding one of the predetermined positions when the drive current is not flowing through the wire coil.

8. The aperture actuator assembly of claim 6 wherein one of the actuator arm and the mounting bracket has a metal portion, and another of the actuator arm and the mounting bracket has a restraining magnet disposed relative to and having an attraction for the metal portion such that the restraining magnet is adapted to retain the actuator arm in position when the drive current is not flowing through the wire coil.

9. The aperture actuator assembly of claim 6 wherein:
    the actuator arm has a plurality of detent magnets corresponding to a plurality of predetermined positions for the actuator arm, each detent magnet having a first polarity; and
    the actuator assembly further comprises a restraining magnet having a second polarity, the restraining magnet being disposed on the mounting bracket relative to the plurality of detent magnets such that the restraining magnet is attracted to a closest one of the detent magnets to retain the actuator arm in a corresponding one of the predetermined positions when the drive current is not flowing through the wire coil.

10. The aperture actuator assembly of claim 6 wherein:
the actuator assembly further comprises a plurality of detent magnets corresponding to a plurality of predetermined positions for the actuator arm, each detent magnet having a first polarity; and
the actuator arm has a restraining magnet having a second polarity, the plurality of detent magnets being disposed on the mounting bracket relative to the restraining magnet such that the restraining magnet is attracted to a closest one of the detent magnets to retain the actuator arm in a corresponding one of the predetermined positions when the drive current is not flowing through the wire coil.

11. The aperture actuator assembly of claim 2 wherein:
the actuator assembly further comprises a mounting bracket extending vertically relative to the radiation detector housing;
the actuator arm is pivotally coupled to the mounting bracket such that the second end of the actuator arm is adapted to rotate in the first lateral direction and the second lateral direction; and
the actuator comprises an electromagnetic solenoid having a drive input and a piston adapted to move along a longitudinal axis of the solenoid between an extended position and a contracted position based on the drive input, the piston having an end operatively coupled to the first end of the actuator arm so that the piston drives the second end of the actuator arm in the first lateral direction when moving towards the extended position and in the second lateral direction when moving towards the contracted position.

12. The aperture actuator assembly of claim 11 wherein the actuator further comprises a latching magnet disposed relative to the solenoid such that the latching magnet holds the piston of the solenoid in a current position when electrical bias present on the drive input is removed, the current position being between the extended position and the contracted position.

13. The aperture actuator assembly of claim 11 wherein actuator arm has a moment arm disposed near the first end of the actuator arm, the moment arm has a distal end, the distal end has a recess adapted to engage and retain the end of the piston.

14. The aperture actuator assembly of claim 2 wherein:
the actuator assembly further comprises a mounting bracket extending vertically relative to the radiation detector housing;
the actuator arm is pivotally coupled to the mounting bracket such that the second end of the actuator arm is adapted to rotate in the first lateral direction and the second lateral direction, the actuator arm has a transverse member disposed near the first end of the actuator arm and defining a first moment arm having a first distal end and a second moment arm having a second distal end; and
the actuator comprises a first electromagnetic solenoid and a second electromagnetic solenoid, each of the solenoids having a drive input and a piston having an end adapted to move along a longitudinal axis of the respective solenoid between an extended position and a contracted position based on the respective drive input, the drive input of the first solenoid being opposite in polarity to the drive input of the second solenoid such that the piston of the first solenoid moves in opposition to the piston of the second solenoid, each piston has an end operatively coupled to the distal end of a respective one of the first moment arm or the second moment arm.

15. The aperture actuator assembly of claim 14 wherein the actuator further comprises a plurality of latching magnets,
wherein a first of the latching magnets is disposed relative to the first solenoid such that the first latching magnet holds the piston of the first solenoid in a first position when electrical bias present on the drive input of the first solenoid is removed, and
wherein a second of the latching magnets is disposed relative to the second solenoid such that the second latching magnet holds the piston of the second solenoid in a second position when electrical bias present on the drive input of the second solenoid is removed.

* * * * *